(12) United States Patent
Matsuzaki et al.

(10) Patent No.: US 6,194,930 B1
(45) Date of Patent: Feb. 27, 2001

(54) DLL CIRCUIT

(75) Inventors: Yasurou Matsuzaki; Masao Nakano; Yasuhiro Fujii, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/320,847

(22) Filed: May 26, 1999

(30) Foreign Application Priority Data

Jun. 11, 1998 (JP) .................................................. 10-163379

(51) Int. Cl.$^7$ ........................................................ H03L 7/06
(52) U.S. Cl. ............................ 327/156; 327/161; 327/158
(58) Field of Search .................................... 327/155, 156, 327/158, 159, 161, 262, 270, 276, 277, 280, 284, 392, 393

(56) References Cited

U.S. PATENT DOCUMENTS 5,118,975 * 6/1992 Hillis et al. ............................ 327/158
6,002,281 * 12/1999 Jones et al. ............................ 327/161

* cited by examiner

Primary Examiner—Kenneth B. Wells
Assistant Examiner—Paul Dinh
(74) Attorney, Agent, or Firm—Arent Fox Kintner Plotkin & Kahn PLLC

(57) ABSTRACT

The present invention is a DLL circuit, which delays a first clock, and generates a control clock having a predetermined phase relation with this first clock. The DLL circuit comprises a variable delay circuit for varying the delay of the first clock; a phase comparator for comparing the phases of the first clock against that of a second clock, generated by delaying for a predetermined time the output of the variable delay circuit, and for generating a phase comparison result signal; and a delay control circuit for supplying to the variable delay circuit a delay control signal, which controls this delay quantity in response to the phase comparison result signal. The delay control circuit generates a single delay control signal, which changes by a minimum delay quantity unit a delay quantity of the variable delay circuit in a first operating period of the DLL circuit, and generates a binary delay control signal, which changes by a binary unit a delay quantity of the variable delay circuit in a second operating period that differs from the first operating period of the DLL circuit. A lock-on state can be achieved in a short time, and stable operation is possible.

14 Claims, 20 Drawing Sheets

FIRST EMBODIMENT

FIG.4
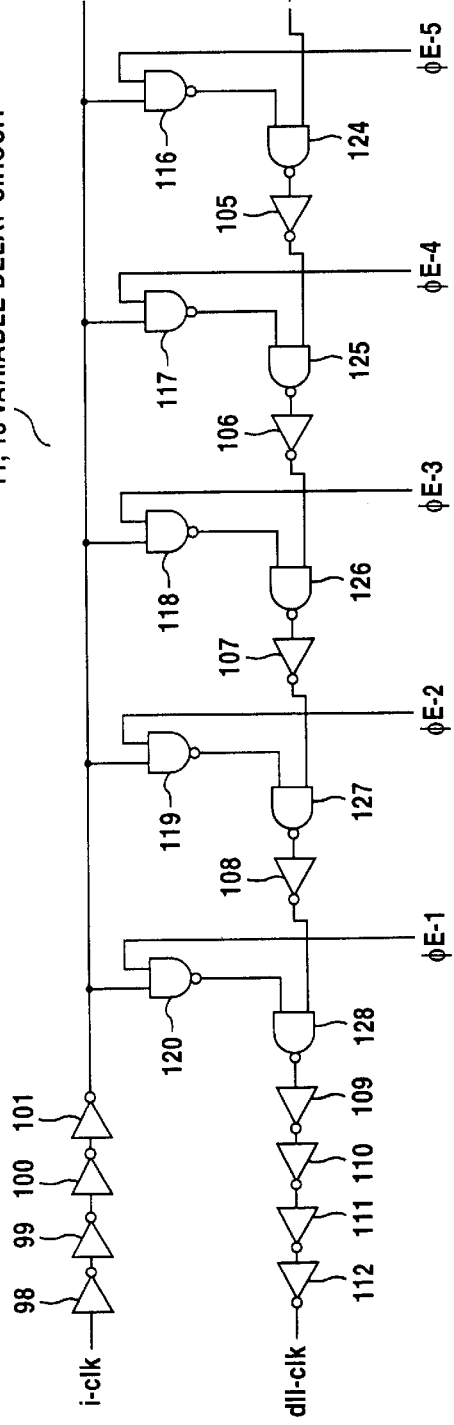
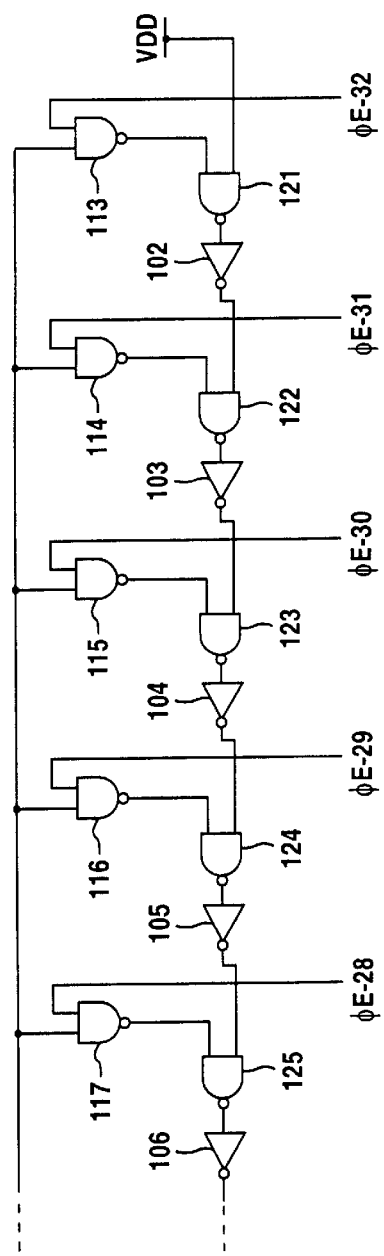

Phase comparating portion of phase comparator

Operation of phase comparing portion

FIRST PHASE COMPARISON OUTPUTTING PORTION 21

Operation of first phase comparison outputting portion 21

FIRST DELAY CONTROL CIRCUIT

FIG.10
SECOND PHASE COMPARISON OUTPUTTING PORTION

Operation of second phase comparison outputting portion

SECOND DELAY CONTROLLER 18

SECOND EMBODIMENT

Phase comparator 16

DELAY CONTROLLER SWITCHING PORTION 25

VARIABLE DELAY CIRCUITS 11, 13 AND FIRST DELAY CONTROLLER 26

FIG. 18

| Q4 | Q3 | Q2 | Q1 | Q0 | |
|----|----|----|----|----|---|
| 1 | 1 | 1 | 1 | 1 | |
| 1 | 1 | 1 | 1 | 0 | |
| 1 | 1 | 1 | 0 | 1 | Count up |
| 1 | 1 | 1 | 0 | 0 | |
| 1 | 1 | 0 | 1 | 1 | |

| Q4 | Q3 | Q2 | Q1 | Q0 | |
|----|----|----|----|----|---|
| 0 | 0 | 1 | 0 | 0 | |
| 0 | 0 | 0 | 1 | 1 | |
| 0 | 0 | 0 | 1 | 0 | Count down |
| 0 | 0 | 0 | 0 | 1 | |
| 0 | 0 | 0 | 0 | 0 | |

SECOND DELAY CONTROLLER 27

OPERATION OF SECOND DELAY CONTROLLER

DLL CIRCUIT

FIELD OF THE INVENTION

The present invention relates to a delay locked loop (hereinafter referred to simply as DLL) circuit, which delays a supplied clock, and automatically synthesizes a clock having a phase of a predetermined relation with the phase of this clock, and more particularly to a DLL circuit, which is capable of shortening the time it takes to achieve a locked state at normal operation start.

DESCRIPTION OF THE RELATED ART

FIG. 1 is a diagram showing an example of a conventional DLL circuit. The DLL circuit of FIG. 1 synthesizes a control clock c-clk1 for outputting data output Dout at a timing in synchronization with the phase of an external clock CLK which is supplied from the outside. In the DLL circuit, a delay-locked loop circuit for a first clock c-clk and a delayed clock d-i-clk which delays this first clock c-clk by a predetermined quantity is formed, and this loop circuit adjusts the timing of these clocks, and in accordance with a delay control signal $\phi_E$ generated thereby, adjusts a delay quantity of a variable delay circuit 11.

In the DLL circuit of FIG. 1, a clock signal CLK supplied from the outside passes through an input buffer 10 to become an internal first clock signal c-clk. This first clock signal c-clk is supplied to variable delay circuit 11 and variable delay circuit 13, respectively, and is also supplied to a phase comparator 16 as first clock input. The clock signal inputted to variable delay circuit 13, after passing through a dummy data output buffer 14 and a dummy input buffer 15, is supplied as second clock input to the phase comparator 16. That is, the output of the dummy input buffer 15 is the second clock signal d-i-clk. The phase comparator 16 compares the phases of the first and second clock signals, and outputs the results of comparison to the delay control circuit 17. The delay control circuit 17 adjusts a delay quantity of variable delay circuit 11 and variable delay circuit 13 on the basis of the phase comparison results. And then, the clock signal c-clk inputted to variable delay circuit 11, after receiving an adjusted delay quantity in accordance with delay control circuit 17, is supplied to the data output buffer 12 as a control clock c-clk1. The data output buffer 12, in synchronization with the supplied control clock signal c-clk1, captures data DATA, and outputs data output Dout to the outside.

With conventional technology, a delay quantity of a variable delay circuit 11, 13 is shifted one stage by one stage at a time, until the phase difference between an internal clock signal c-clk synthesized from an external clock signal CLK, and a dummy internal clock signal d-i-clk become, for example, 360 degrees (clock phase match state) and lock on. Because clock cycle fluctuations resulting from changes in power source voltage and ambient temperature are small in the normal active operating state, there are no problems with such a delay quantity single shift system, even when the system shifts in minimum delay units. Rather, since clock cycle fluctuations are small, a single shift system that shifts a delay quantity in minimum delay units is capable of performing phase adjustment in a more stable manner.

However, at operation start when power is turned ON, and at operation restart, which recovers from a standby mode or a power down mode, it takes time to establish a delay quantity required for the DLL circuit to lock on to a variable delay circuit 11, 13, which in turn increases the time to the start of actual operations, such as read and write operation, in the memory device, into which this DLL circuit is built.

For example, when power is supplied to the device into which the DLL circuit is built, after resetting a delay quantity of a variable delay circuit 11, 13 to the initial state, a delay quantity thereof is adjusted. For this reason, the time until the DLL circuit locks on can be longer. In particular, when a delay quantity for locking on is far away from a delay quantity at the above-mentioned reset, a longer time is required until the above-mentioned lock-on is achieved.

Further, when it comes to restarting a DLL circuit-equipped device pursuant to standby mode recovery or power down mode recoverey, since the clock frequency is lowered and/or the power voltage is reduced to cut back on power consumption in the standby mode or the power down mode, a delay quantity of a variable delay circuit 11, 13 deviates greatly from a delay quantity established in a normal active state. Consequently, the time to DLL circuit lock-on increases in the normal operation start period when recovering from the standby mode or the power down mode.

SUMMARY OF THE INVENTION

Accordingly, an object of the present invention is to provide a DLL circuit, which is capable of shortening the time until lock-on is achieved at DLL circuit normal operation start, or at normal operation restart following recovery from a standby or power down mode.

Another object of the present invention is to provide a DLL circuit, which is capable of shortening the time from a DLL circuit lock-miss state to a lock-on state.

To achieve the above-mentioned objects, the present invention is a DLL circuit, which delays a first clock, and generates a control clock having a predetermined phase relation with this first clock, this DLL circuit comprises: a variable delay circuit for varying the delay of the first clock; a phase comparator for comparing the phase of the first clock with that of a second clock, which is generated by delaying for a predetermined time the output of the variable delay circuit, and for generating a phase comparison result signal; and a delay control circuit for supplying to the variable delay circuit a delay control signal, which controls this delay quantity in response to the phase comparison result signal, wherein the delay control circuit generates a single delay control signal as the delay control signal, which shifts by a minimum delay quantity unit said delay quantity of the variable delay circuit in a first operating period of the DLL circuit, and generates a binary delay control signal as the delay control signal, which shifts by a binary unit said delay quantity of the variable delay circuit in a second operating period that differs from the first operating period of the DLL circuit.

According to the above-mentioned invention, since phase adjustment is performed in a second operating period in accordance with controlling a delay quantity using a binary shift system, a lock-on state, or a state approximating same can be achieved in a short time, and since phase adjustment is performed in a first operating period in accordance with controlling a delay quantity using a single shift system, stable operation is possible.

In the above-described present invention, according to an embodiment, the delay control circuit comprises a first delay control circuit, which is activated in the above-mentioned first operating period, and which generates the single delay control signal; and a second delay control circuit, which is activated in the above-mentioned second operating period, and which generates the binary delay control signal.

According to the above-described embodiment, by activating the first and second delay control circuits of the delay control circuit in the respective operating periods, it is possible to readily switch between a binary shift system and a single shift system.

Furthermore, in the above-described invention, according to an embodiment the variable delay circuit has a plurality of gates connected in series, and the number of gates through which the first clock passes is variably set in accordance with the delay control signal, and the number of gates inside the variable delay circuit are changed by the minimum delay quantity unit in accordance with a delay control signal generated by the single delay control signal, and the number of gates inside the variable delay circuit are changed in succession to ½ of the total, and thereafter to ¼ or ¾ . . . , and thereafter to either one among $(2^1-1)/2^n-(2^n-1)/2^n$ (provided the numerator is an odd number) in accordance with a delay control signal generated by the binary delay control signal.

Furthermore, in the above-described invention, according to an embodiment, the above-mentioned variable delay circuit has a plurality of delay units, the delay quantities of which are weighted in binary, and the delay unit through which the first clock passes is variably selected in accordance with the delay control signal, and the delay units inside the variable delay circuit are changed by a unit of the delay units having the minimum delay quantity in accordance with a delay control signal generated by the single delay control signal, and the delay units inside the variable delay circuit are changed in succession so that the delay therein become ½ of the total, and thereafter ¼ or ¾ . . . , and thereafter either one among $(2^1-1)/2^n-(2^n-1)/2^n$ (provided the numerator is an odd number) in accordance with a delay control signal generated by the binary delay control signal.

BRIEF DESCRIPTION OF THE DRAWINGS

FIG. 4 is a diagram showing examples of variable delay circuits 11, 13;

FIG. 10 is a circuit diagram of a second phase comparison outputting portion 22 of a phase comparator 16;

FIG. 18 is a diagram showing the operation of a counter 590;

DETAILED DESCRIPTION OF PREFERRED EMBODIMENTS

The aspects of the embodiment of the present invention are described below in accordance with the figures. However, the technical scope of the present invention is not limited to these aspects of the embodiment.

First Aspect of the Embodiment

Figure 1:
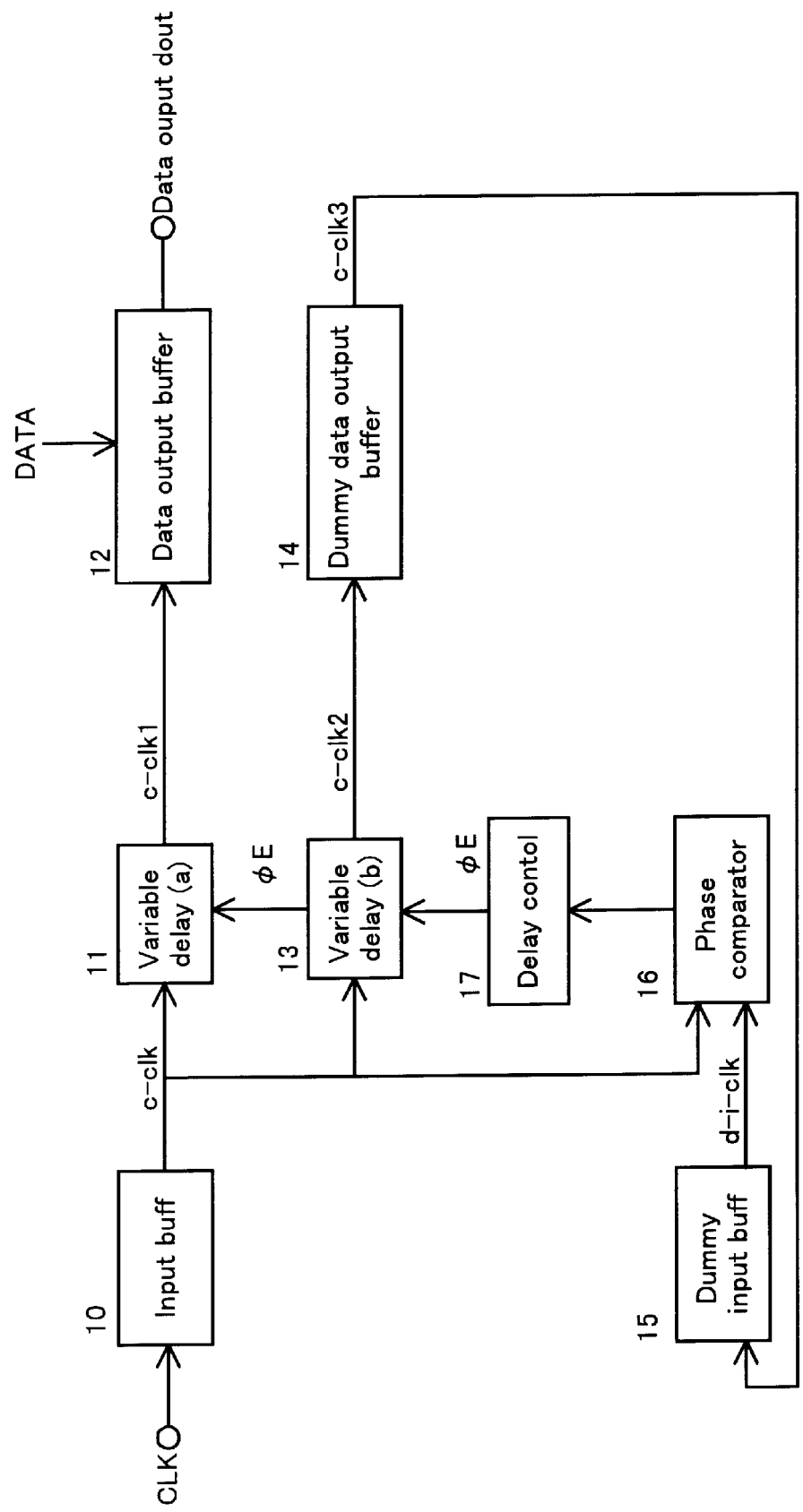
FIG. 1 is a diagram showing an example of a conventional DLL circuit.
Figure 2:
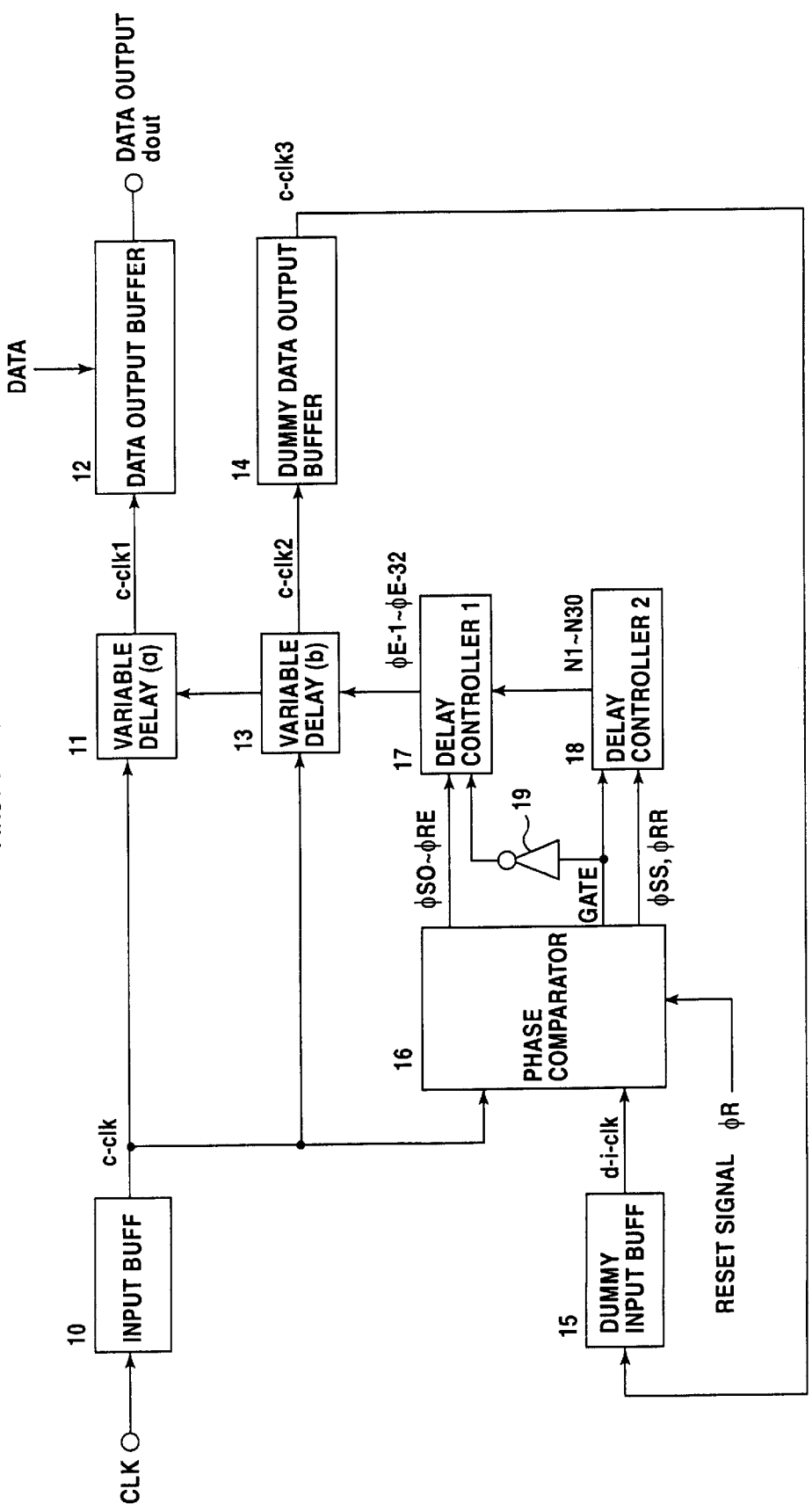
FIG. 2 is a schematic diagram showing a DLL circuit of a first aspect of the embodiment of the present invention.

FIG. 2 is a schematic diagram showing a DLL circuit of a first aspect of the embodiment of the present invention. The same reference numbers are furnished for portions that correspond to the conventional example of FIG. 1. In the DLL circuit of FIG. 2, a supplied clock CLK is captured by an input buffer 10, and a first clock c-clk is outputted, and supplied to a variable delay circuit 11, 13, and phase comparator 16. And then, a clock c-clk2 outputted from a variable delay circuit 13 passes through a dummy data output buffer 14 and a dummy input buffer 15, and is supplied to a phase comparator 16 as a second clock d-i-clk.

The phase difference of these first and second clocks is detected by the phase comparator 16, and phase comparison result signals $\phi_{SO}-\phi_{RE}$, and $\phi_{SS}$, $\phi_{RR}$ are outputted. In accordance with these phase comparison result signals, a first and second delay control circuit 17, 18 supply to a variable delay circuit 11, 13 a delay control signal $\phi_{E-1}-\phi_{E-32}$, which controls a delay quantity thereof. When the phase of the second clock d-i-clk leads that of the first clock c-clk, phase comparison result signals $\phi_{SO}$, $\phi_{SE}$ and $\phi_{SS}$ are outputted, and, in accordance therewith, the delay control circuits 17, 18 supply delay control signals $\phi_{E-1}-\phi_{E-32}$ so as to increase a delay quantity of variable delay circuits 13 and 16. Further, when the phase of the second clock d-i-clk lags that of the first clock c-clk, phase comparison result signals $\phi_{RO}$, $\phi_{RE}$ and $\phi_{RR}$ are outputted, and, in accordance therewith, the delay control circuits 17, 18 supply delay control signals $\phi_{E-1}-\phi_{E-32}$ so as to decrease a delay quantity of variable delay circuits 13 and 16. As a result, a delay quantity of the variable delay circuits 11, 13 is controlled so that the phases of the first and second clocks are identical.

As a result thereof, the phase of the output clock c-clk3 of the dummy data output buffer 14 is controlled so as to be identical with the phase of the supplied clock CLK. In the meantime, readout data DATA from a memory cell not shown in the figure is captured by the data output buffer 12 in synchronization with the control clock c-clk1, and outputted as data output Dout. And then, because a delay quantity of variable delay circuit 11 is controlled the same as that of variable delay circuit 13, the output timing of the data output Dout is made identical to the phase of the supplied clock CLK.

Further, the phases of the first and second clocks do not necessarily have to be controlled so as to be identical, but rather, can be controlled so as to constitute a predetermined phase relation.

The first aspect of the embodiment provides a first and second delay control circuit 17, 18. And then, in accordance with a gate signal GATE from the phase comparator 16, the first delay control circuit 17 is activated in the first operating period during normal operation. Further, in the second operating period when power is turned ON or when there is a recovery from a standby or power down mode, the second delay control circuit 18 is activated. And then, in the above-mentioned first operating period (at normal operation), the first delay control circuit 17 outputs delay control signals $\phi_{E-1}$–$\phi_{E-32}$ SO as to shift in minimum delay units a delay quantity of a variable delay circuit 11, 13 each time phase comparison is performed. Further, in the above-mentioned second operating period (at normal operation start), the second delay control circuit 18 generates binary delay control signals N1–N30 so as to make a delay quantity of a variable delay circuit 11, 13 constitute ½ of the total delay quantity, and thereafter ¼ or ¾ . . . , and thereafter either one among $(2^1-1)/2^n$–$(2^n-1)/2^n$ (provided the numerator is an odd number) each time phase comparison is performed. As described below, delay control signals $\phi_{E-1}$–$\phi_{E-32}$, which make the above-mentioned binary shift possible, are outputted in accordance with the binary delay control signals N1–N30 thereof.

As is clear from the detailed circuit description hereinbelow, when power is turned ON, and at standby mode or power down mode recovery, the state of the loop circuit of the DLL circuit is considerably removed from a lock-on state. Therefore, in a second operating period such as this, it takes a long time to lock on with a control method that shifts a delay quantity of a variable delay circuit 11, 13 in minimum delay units each time phase comparison is carried out as in a conventional example. Accordingly, in the embodiment, in such a second operating period, a gate signal GATE is set to H level in response to the supply of a reset signal $\phi_R$, and a second delay control circuit 18 is activated. The delay control of a variable delay circuit 11, 13 is performed in accordance with this second delay control circuit 18. In this example, when delay quantity control corresponding to phase comparison results is carried out 3 times in accordance with the second delay control circuit 18, an H level inverted gate signal is supplied to the first delay control circuit 17 via an inverter 19, and the delay control is switched over to the first delay control circuit 17 from the second delay control circuit 18 so that the DLL circuit transitions to the first operating period, which is the normal operating period. In this first operating period, single shift method delay quantity control is performed in accordance with the first delay control circuit 17 the same as in the conventional example.

Furthermore, here normal operation refers to an active operating state, in which a normal cycle clock CLK is supplied, and phase comparisons are performed and a delay quantity are set at a frequency corresponding thereto. Therefore, normal operation start includes when normal operation is started by returning to a normal state from a state, in which the frequency of phase comparison is low due to a power down mode, and when power is turned ON.

Figure 3:
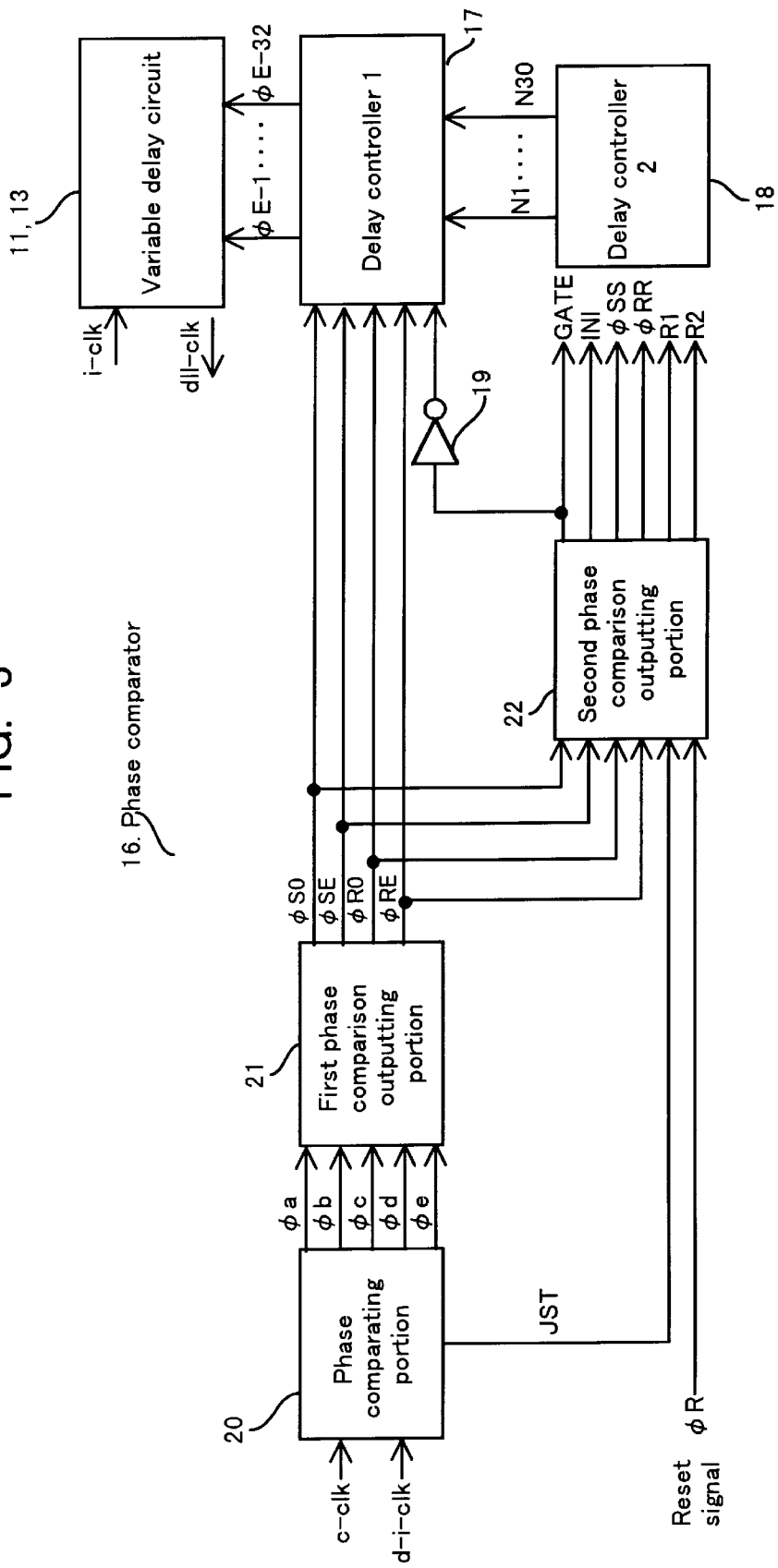
FIG. 3 is a diagram showing a phase comparator 16.

FIG. 3 is a diagram showing a phase comparator 16. The phase comparator 16, as shown in FIG. 3, has a phase comparing portion 20 for comparing the phase of a first clock c-clk against that of a second clock d-i-clk, which is a delayed version thereof; a first phase comparison outputting portion 21 for supplying comparison results to the first delay control circuit 17; and a second phase comparison outputting portion 22 for supplying comparison results to the second delay control circuit 18. A reset signal $\phi_R$ generated when power is turned ON, and at standby mode or power down mode recovery, is supplied to the second phase comparison outputting portion 22, and in accordance therewith, a gate signal GATE is supplied to the second delay control circuit 18, and furthermore, an inverted signal thereof is supplied to the first delay control circuit 17 via an inverter 19. Further, the phase comparing portion 20 generates a phase match signal JST, and supplies same to the second phase comparison outputting portion 22 when the phase of both clocks c-clk and d-i-clk is matched. The second phase comparison outputting portion 22, in response to this phase match signal JST, forcibly sets the gate signal GATE to L level, activates the first delay control circuit 17, and causes the DLL circuit to transition to a first operating period even if in the middle of a second operating period.

FIG. 4 is a diagram showing an example of a variable delay circuit 11, 13. This variable delay circuit delays an inputted clock i-clk, and outputs an outputted clock dll-clk. As shown in the figure, a variable delay circuit 11, 13 is constituted from a plurality of inverters 98-112, and NAND gates 113–128. A clock, which delays the inputted clock i-clk, is supplied as one of the inputs of the NAND gates 113–120, and delay control signals $\phi_{E-1}$–$\phi_{E-32}$ are supplied as the other input. Any one of the delay control signals $\phi_{E-1}$–$\phi_{E-32}$ constitutes an H level, and the remainder constitute L levels.

Hypothetically, if delay control signal $\phi_{E-1}$ is H level, in accordance with the other delay control signals being L level, the output of NAND gates 113–119 becomes H level. As a result thereof, NAND gates 121–127 all become L level output, and inverters 102–108 all become H level output. Accordingly, the inputted clock i-clk is outputted as the outputted clock dll-clk having a delay quantity of a total of 10 stages of gates, i, e, 4 inverters 98–101, NAND gates 120, 128, and 4 inverters 109–112. This state is the minimum delay quantity.

Then, when the H level delay control signal $\phi_{E-1}$–$\phi_{E-32}$ shifts to the right in the figure, the delay quantities of 2 stages of gates, i, e, a NAND gate 127 and an inverter 108, are added. Then, when delay control signal $\phi_{E-32}$ becomes H level, this constitutes the maximum delay quantity. In other words, when the H level delay control signal among the delay control signals $\phi_{E-1}$–$\phi_{E-32}$ shifts one to the right, a delay quantity is increased by 2 stages, a NAND gate and an inverter, and when it shifts one to the left, a delay quantity is decreased by the same 2 stages. This 2-stage delay quantity is the minimum delay unit in a single shift method.

Figure 5:
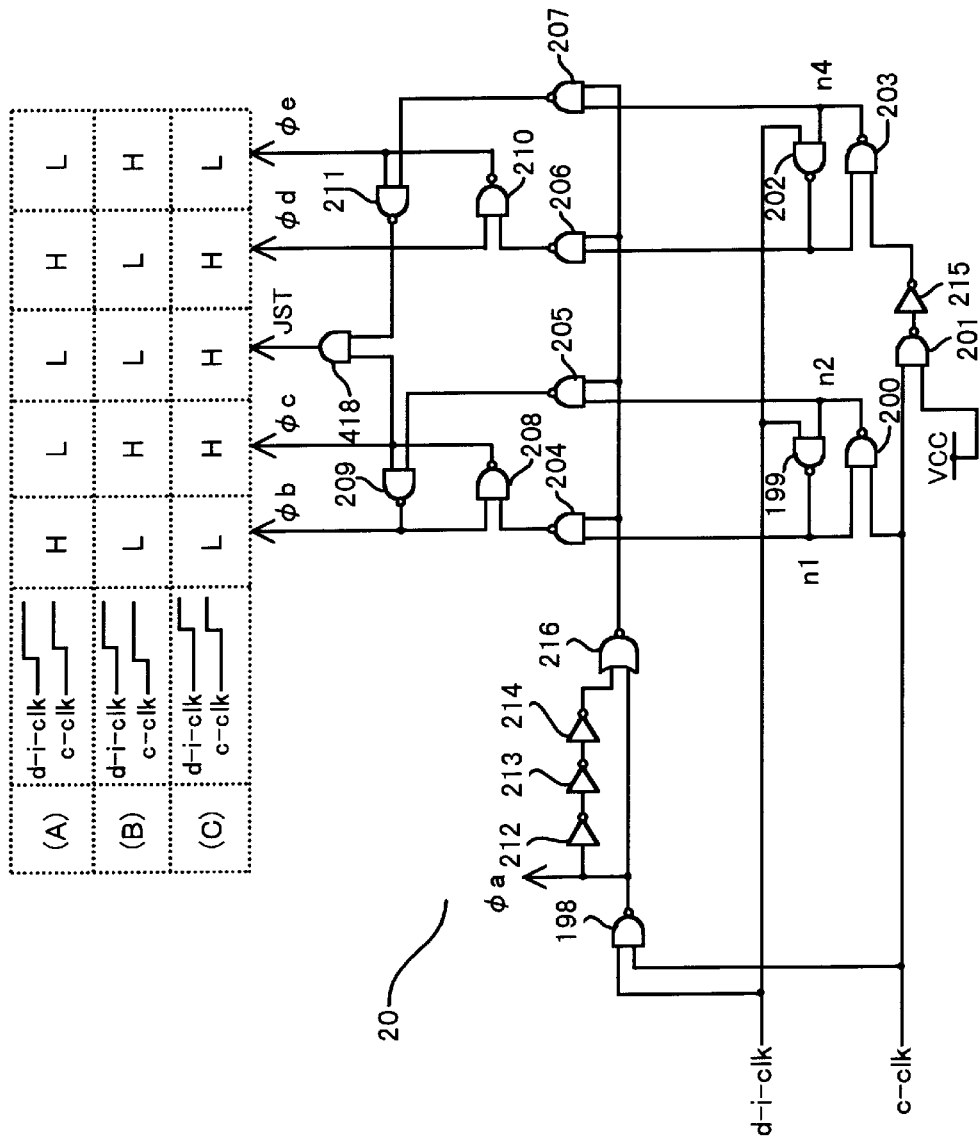
FIG. 5 is a circuit diagram of a phase comparing portion 20 inside a phase comparator 16.
Figure 6:
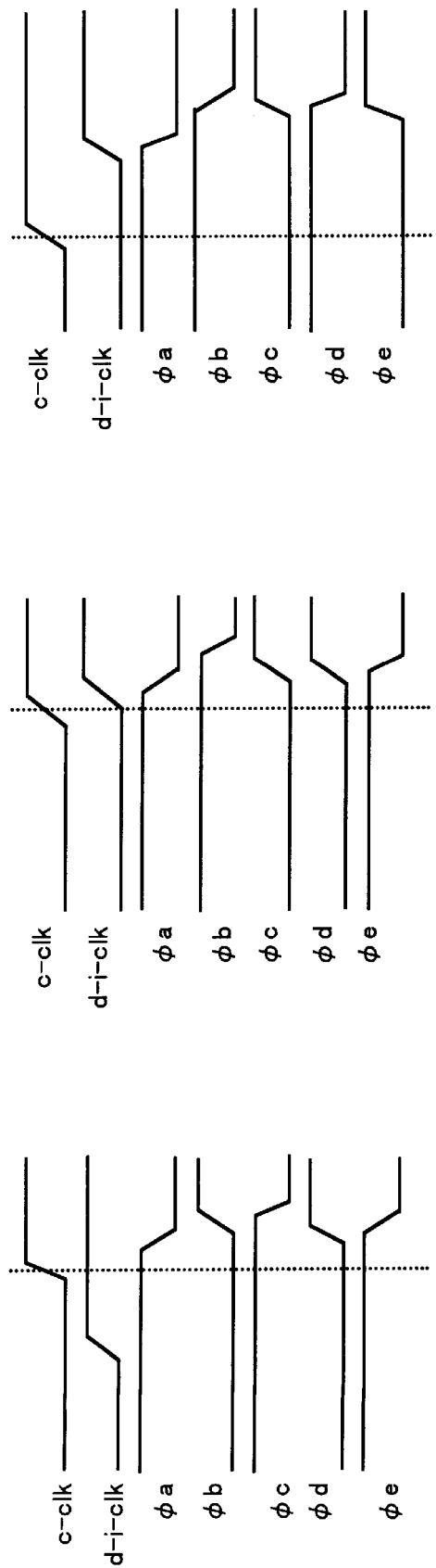
FIG. 6 is a waveform diagram showing the operation of the phase comparing portion.

FIG. 5 is a circuit diagram of the phase comparing portion 20 inside a phase comparator 16. And FIG. 6 is a waveform diagram showing the operation of the phase comparing portion 20. This phase comparing portion 20 detects the phase relation between a first clock c-clk and a second clock d-i-clk in the portion comprising NAND gates 199–203 and an inverter 215, and generates the detection results thereof in nodes n1–n4. The phase relation of the two clocks is categorized into a state, wherein the phase of the second clock d-i-clk leads that of the first clock c-clk as shown in FIG. 6 (A), a state, wherein the phases of the two clocks are substantially or approximately identical as shown in FIG. 6 (B), and a state, wherein the phase of the second clock d-i-clk lags that of the first clock c-clk as shown in FIG. 6 (C).

In the case of the state of FIG. 6 (A), when both clocks are L level, nodes n1–n4 are all H level, and thereafter, the second clock d-i-clk transitions to H level first, and the node states become:

n1=L, n2=H, n3=L, n4=H

Thereafter, even if the first clock c-clk transitions to H level later, the states of the above-mentioned nodes n1–n4 do not change. NAND gate 198 output changes to L level when both clocks are H level, and, from the falling edge thereof, an H level pulse of a predetermined width is outputted from NOR gate 216. This H level pulse is supplied to NAND gates 204–207 as captured pulse, and the states of nodes n1–n4 are captured by a latch gate comprising NAND gates 208, 209, and a latch gate comprising NAND gates 210, 211, respectively. Therefore, signals φb, φc, φd, φe, as shown in the table of FIG. 5 become:

φb=H, φc=L, φd=H, φe=L

The state of FIG. 6(B) is a case, wherein the phase of the second clock d-i-clk lags behind that of the first clock c-clk within the scope of the delay time of NAND gate 201 and inverter 215. In this case, the first clock c-clk transitions to H level first, and the node states become:

n1=H, n2=L

Furthermore, the output of inverter 215 becomes H level even after the second clock d-i-clk, and the node states become:

n3=L, n4=H

Therefore, these node states are latched at the timing at which both clocks become to H level, and signals φb, φc, φd, φe, as shown in the table of FIG. 5, become:

φb=L, φc=H, φd=H, φe=L

In this case, because this means that the phases are matched, the phase match signal JST output of AND gate 418 is also outputted H level.

In the state of FIG. 6(C), the first clock c-clk transitions to H level first, and the states of the nodes become:

n1=H, n2=L, n3=H, n4=L

Thereafter, even if the second clock d-i-clk transitions to H level afterwards, the states of the above-mentioned nodes n1–n4 do not change. These states are latched at the timing at which both clocks become to H level, and signals φb, φc, φd, φe, as shown in the table of FIG. 5, become:

φb=L, φc=H, φd=L, φe=H

Figure 7:
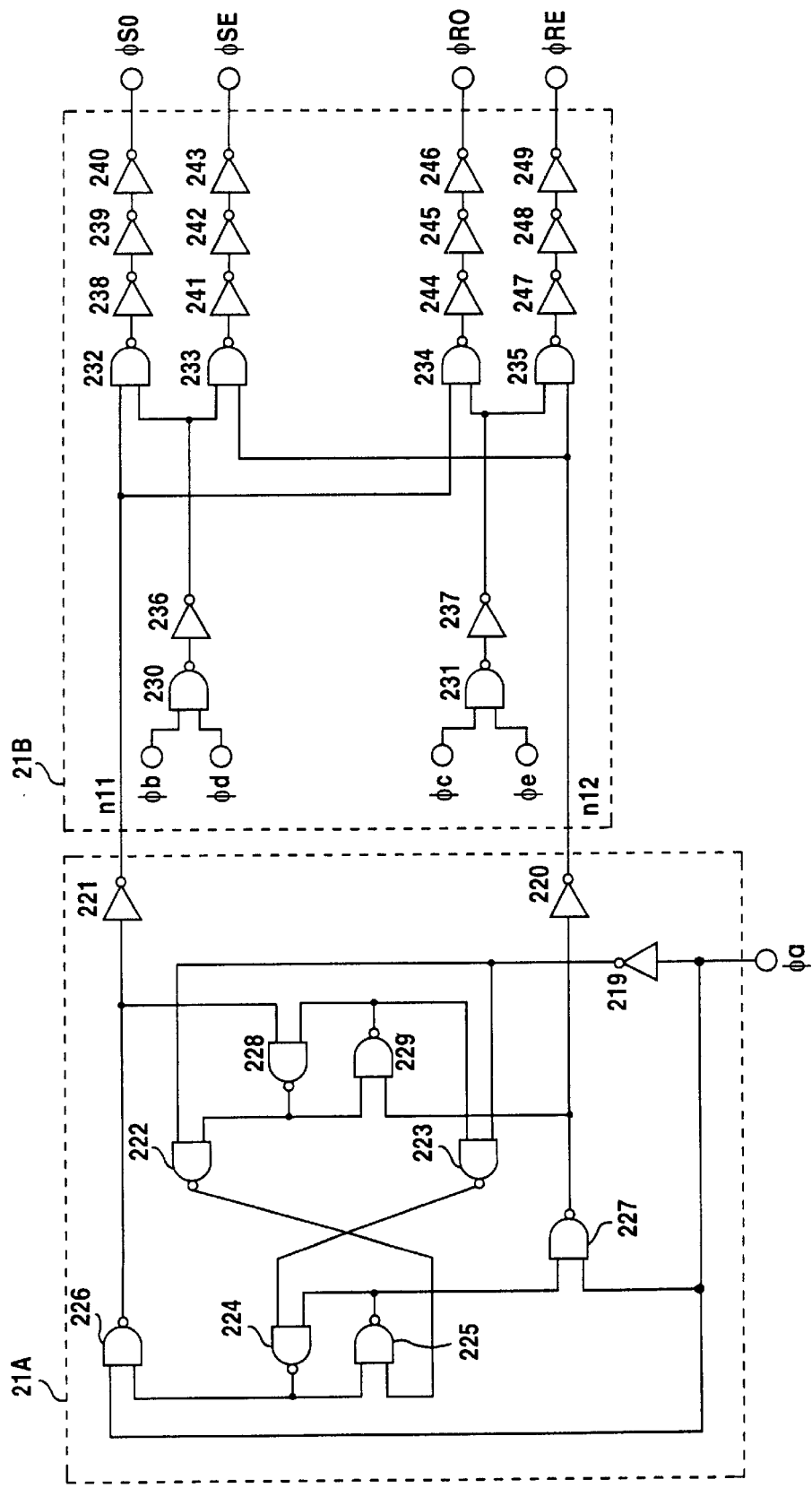
FIG. 7 is a circuit diagram of a first phase comparison outputting portion 21 of a phase comparator 16.
Figure 8:
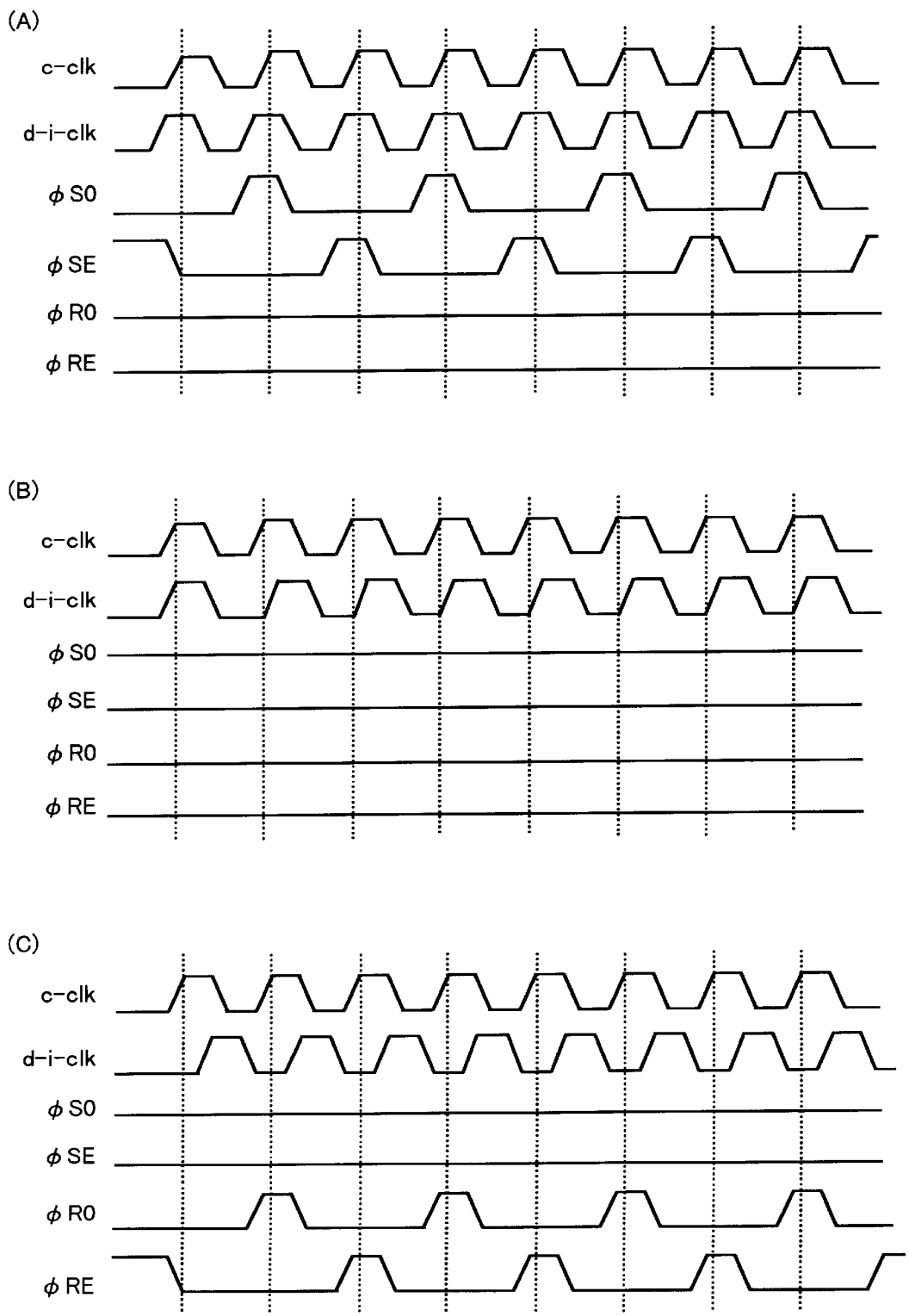
FIG. 8 is a waveform diagram showing the operation of a phase comparison outputting portion 21.

FIG. 7 is a circuit diagram of a first phase comparison outputting portion 21 of the phase comparator 16. Further, FIG. 8 is a waveform diagram showing the operation of this phase comparison outputting portion 21. (A), (B), (C) of the waveform diagram correspond respectively to (A), (B), (C) of FIG. 5 and FIG. 6.

The phase comparison outputting portion 21 constitutes a frequency divider circuit 21A for dividing in ½ the frequency of a timing signal φa generated at the timing of phase comparison of the two clocks, and an output circuit 21B for outputting phase comparison result signals $\phi_{SO}$–$\phi_{RE}$ based on signals φb, φc, φd, φe generated in accordance with the phase relation of the two clocks in response to the timing of the output from this frequency divider circuit 21A.

The ½ frequency divider circuit 21A constitutes a JK flip-flop, and the two clocks c-clk, d-i-clk being H level together is detected by NAND gate 189 (FIG. 5), the ½ frequency divider circuit 21A divides the detection pulse φa thereof in ½, and generates reverse phase pulse signals n11 and n12. The detection pulses φa are supplied to gates 226, 227, the inverted detection pulses φa are supplied to gates 222, 223, and the inverted signals are transferred between the latch circuit comprising gates 228, 229 and the latch circuit comprising gates 224, 225. As a result thereof, ½ frequency divided reverse phase pulse signals n11, n12 are generated.

The output circuit 21B decodes sampling latched signals φb, φc, φd, φe, making the output of inverter 236 H level when the phase of the first clock c-clk lags that of the second clock d-i-clk (state (A)), making the outputs of inverters 236 and 237 L level when the phases of both clocks are matched (state (B)), and making the output of inverter 237 H level when the phase of the first clock c-clk leads that of the second clock d-i-clk (state (C)).

Therefore, when in the above-mentioned (A) state, the output circuit 21B, in accordance with the decode function of NAND gates 232–235, alternately sets to H level the phase comparison result signals $\phi_{SO}$, $\phi_{SE}$, which increase a delay quantity of variable delay circuit 13, while NAND gates 232, 233 responding to timing signals n11, n12, so that the phase of the second clock d-i-clk is delayed. In other words, just as shown in FIG. 8(A). Further, when in the above-mentioned (B) state, the output circuit 21B does not generate a phase comparison result signal $\phi_{SO}$-$\phi_{SE}$, just as in FIG. 8(B). And when in the above-mentioned (C) state, as in FIG. 8(C), the output circuit 21B alternately sets to H level the phase comparison result signals $\phi_{RO}$, $\phi_{RE}$, which decrease a delay quantity of variable delay circuit 13, while NAND gates 234, 235 responding to timing signals n11, n12, so that the phase of the second clock d-i-clk is advanced.

Figure 9:
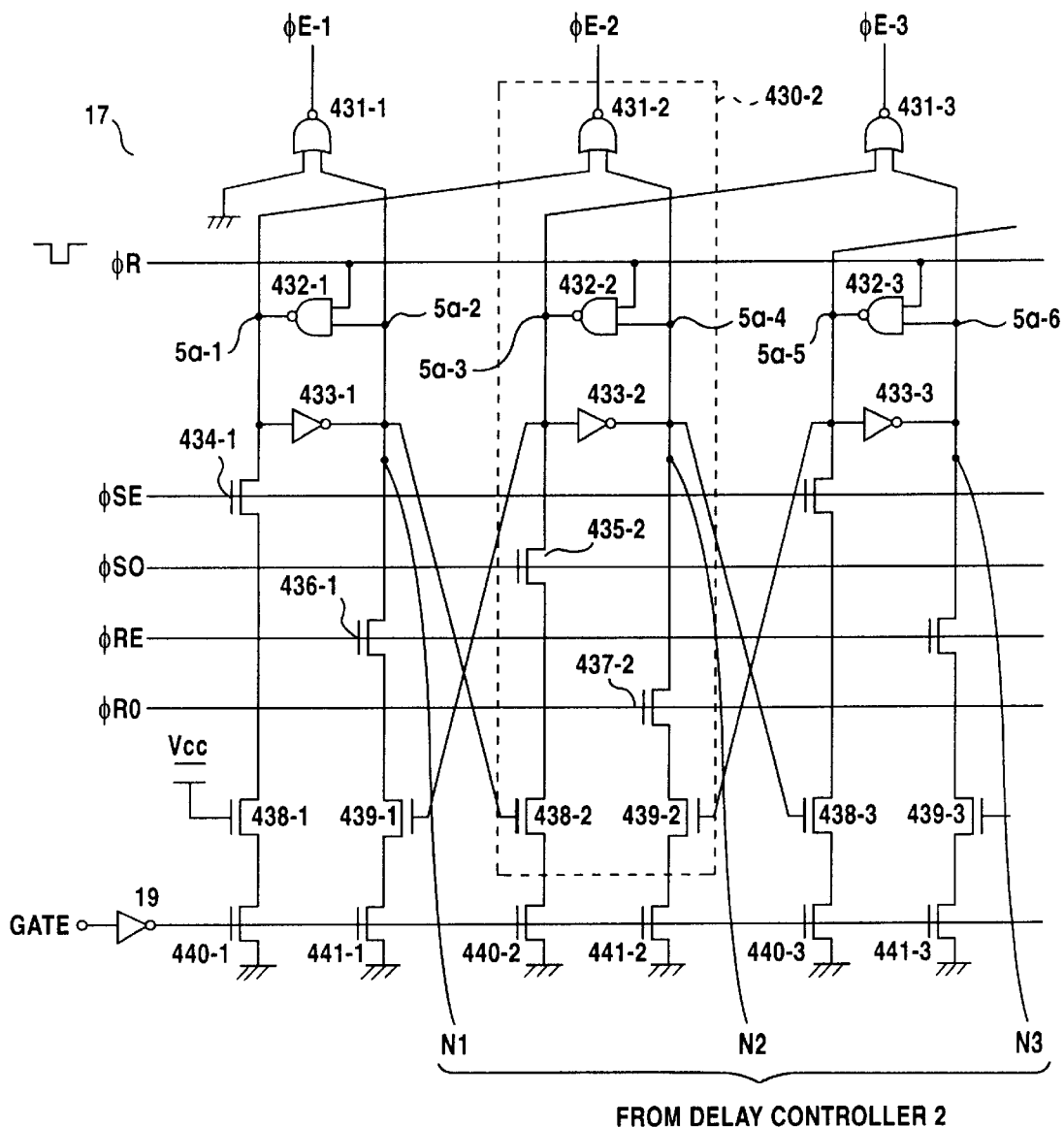
FIG. 9 is a circuit diagram showing a portion of the constitution of a first delay control circuit 17.

FIG. 9 is a circuit diagram showing a portion of the constitution of the first delay control circuit 17. The first delay control circuit 17, as shown in FIG. 3, generates a single delay control signal (node 5a-1–node 5a-6), which shifts by a minimum delay unit a delay quantity of variable delay circuit 11, 13 in response to a phase comparison result signal $\phi_{SO}$-$\phi_{RE}$ from the first phase comparison outputting portion 21, and outputs a delay control signal $\phi_{E-1}$–$\phi_{E-3}$ from NOR gates 431-1–431-3. As shown in FIG. 4, the delay control signal $\phi_{E-1}$–$\phi_{E-32}$ constitutes 32 bits, and only the first 3-bit portion of same is shown in FIG. 9.

The first delay control circuit 17 shifts the H level delay control signal $\phi_E$ to the right in accordance with phase comparison result signals $\phi_{SO}$, $\phi_{SE}$, increasing a delay quantity of the variable delay circuits, and shifts the H level delay control signal $\phi_E$ to the left in accordance with phase comparison result signals $\phi_{RO}$, $\phi_{RE}$, decreasing the delay quantity of the variable delay circuits.

Each stage of the delay control circuit has a latch circuit, which in the first stage, for example, comprises NAND gate 432-1 and inverter 433-1. And the first stage of the delay control circuit has transistors 434-1, 436-1, which forcibly invert the state of latch circuit 432-1 and 433-1 in accordance with phase comparison result signals $\phi_{SO}$-$\phi_{RE}$. Transistors 438-1, 439-1 are provided so that the latch circuit is not inverted by transistors 434-1, 436-1 in cases that do not call for inversion. The second stage-third stage circuits are also constituted in the same manner. These transistors are all n-channel type.

When a gate signal GATE is H level, n-channel transistors 440-1–3, 441-1–3 are all turned OFF by inverter 19, and the first delay control circuit transitions to an inactive state. Further, when a gate signal GATE is L level, n-channel transistors 440-1–3, 441-1–3 are all turned ON, and the first delay control circuit transitions to an active state.

Now, hypothetically, if an L level pulse reset signal $\phi_R$ were to be applied, the outputs of NAND gates 432-1–3 would all become H level, and the outputs of inverters 433-1–3 would all become L level. Therefore, node 5a-2 transitions to L level, and the delay control signal $\phi_{E\text{-}1}$ output of NOR gate 431-1 transitions to H level. Further, since nodes 5a-1, 5a-3 are both H level, all other delay control signals $\phi_{E\text{-}2}$, $\phi_{E\text{-}3}$ become L level. That is, in response to a reset signal $\phi_R$, delay control signal $\phi_{E\text{-}1}$ becomes H level, and variable delay circuits 11, 13 are controlled to minimum delay times.

Next, when phase comparison is carried out, one of the phase comparison result signals $\phi_{SO}$-$\phi_{RE}$ becomes H level in accordance with the phase relation of the two clocks. Now, if the phase comparison result signal $\phi_{SE}$ were to become H level, transistor 434-1 would conduct, node 5a-1 would be forcibly pulled down to L level, and the node 5a-2 output of inverter 433-1 would be forcibly pulled up to H level. As a result thereof, the output $\phi_{E\text{-}1}$ of NOR gate 431-1 transitions to L level. Further, since nodes 5a-1 and 5a-4 are both L level, the output $\phi_{E\text{-}2}$ of NOR gate 431-2 transitions to H level. And then the first stage and second stage latch circuits maintain that state. Furthermore, when the phase comparison result signal $\phi_{SO}$ transitions to H level in accordance with the phase comparison of thereafter, in accordance with the same operation, nodes 5a-3 and 5a-6 both become L level, and delay control signal $\phi_{E\text{-}3}$ becomes H level. In this manner, in accordance with phase comparison result signals $\phi_{SE}$ and $\phi_{SO}$, delay control signal $\phi_E$ shifts to the right so as to lengthen delay time of the variable delay circuits 11, 13.

Conversely, in accordance with phase comparison result signals $\phi_{RE}$ and $\phi_{RO}$, delay control signal $\phi_E$ shifts to the left so as to shorten delay time in accordance with an operation that is opposite that described above. Furthermore, as is clear from the operation of the outputting portion of the above-mentioned phase comparator, phase comparison result signals $\phi_{SE}$ and $\phi_{SO}$ are alternately generated at each phase comparison when the second clock d-i-clk leads, and phase comparison result signals $\phi_{RE}$ and $\phi_{RO}$ are alternately generated at each phase comparison when the second clock d-i-clk lags.

Figure 10:
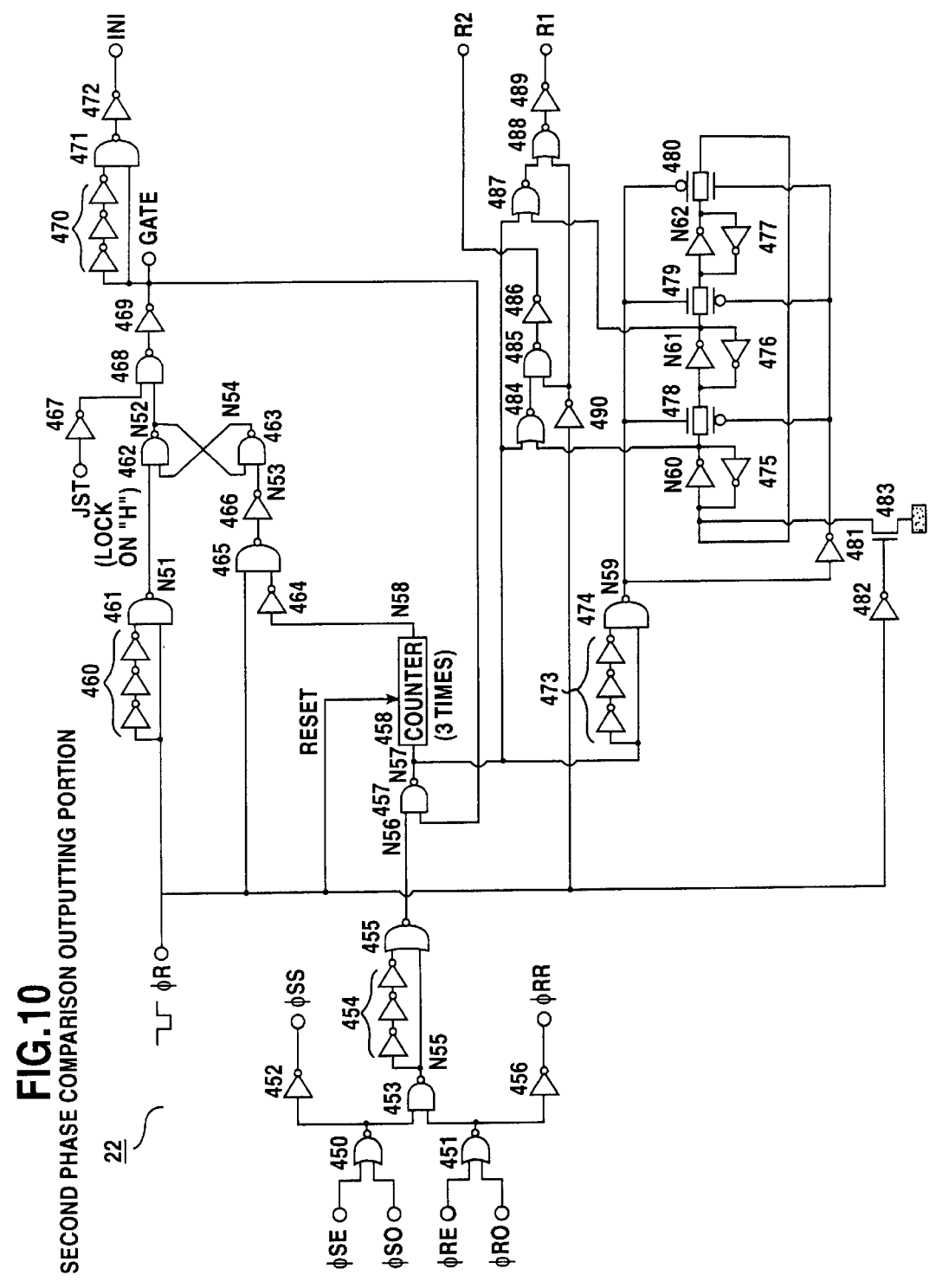
Figure 11:
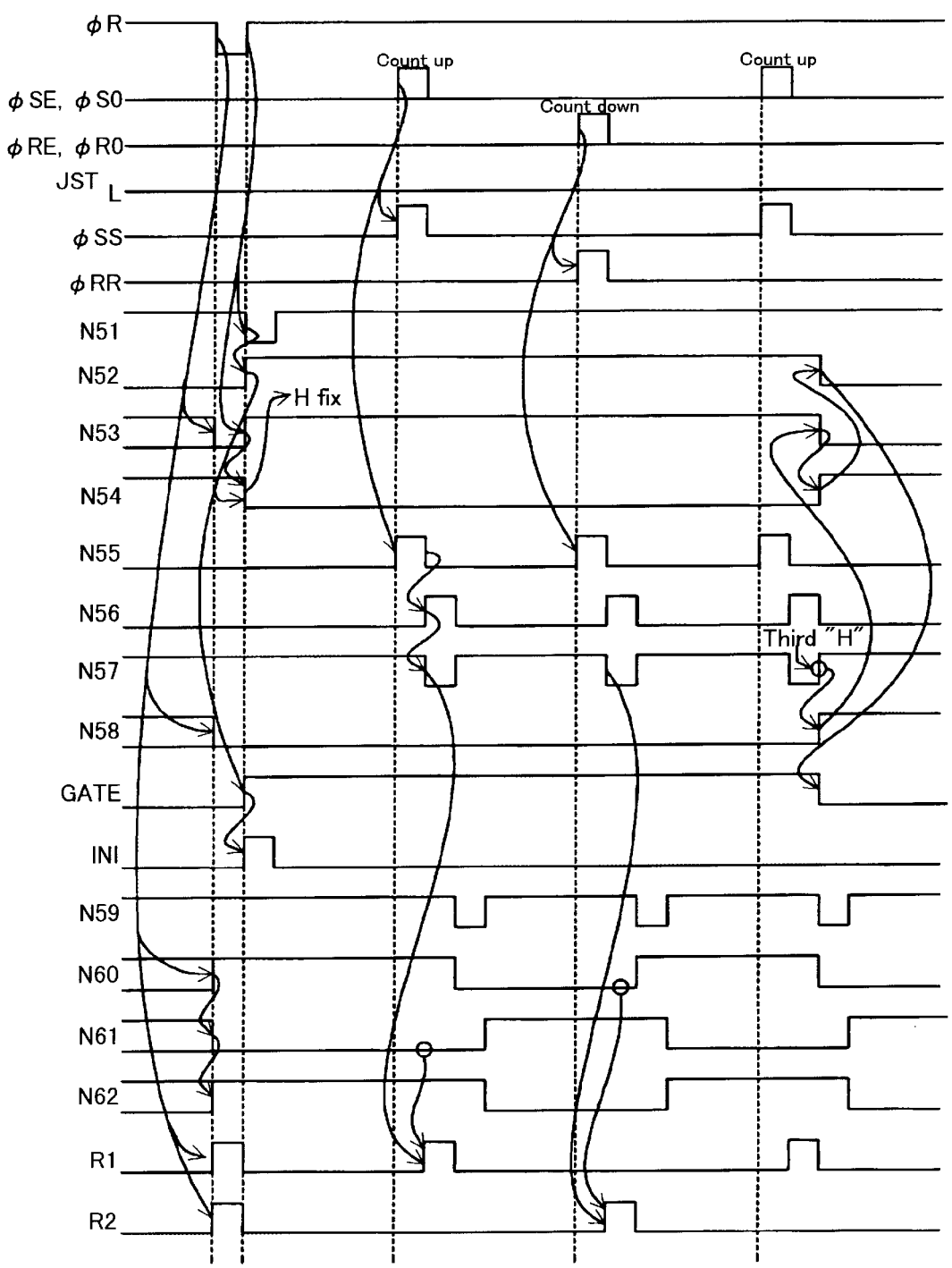
FIG. 11 is a waveform diagram showing the operation of a phase comparison outputting portion 22.

FIG. 10 is a circuit diagram of a second phase comparison outputting portion 22 of the phase comparator. And FIG. 11 is a waveform diagram showing the operation of the phase comparison outputting portion 22. The second phase comparison outputting portion 22, as shown in FIG. 10, constitutes NAND gates, NOR gates, and inverters 450–489. In the basic operation of this second phase comparison outputting portion 22, a gate signal GATE is set to H level in response to a reset signal $\phi_R$, so that the second delay control circuit is activated, and an initialization signal INI is set to H level, then signals $\phi_{SS}$ and $\phi_{RR}$ are generated in response to a phase comparison result signal $\phi_{SO}$-$\phi_{RE}$ of thereafter, and furthermore, when a phase comparison result signal $\phi_{SO}$-$\phi_{RE}$ is received 3 times, a gate signal GATE is set to L level in accordance with a counter 458. Further, H level pulse control signals R1, R2 are generated simultaneously in response to the reset signal $\phi_R$, and H level pulse control signals R1, R2 are alternately generated for each phase comparison result signal $\phi_{SO}$-$\phi_{RE}$ of thereafter.

This operation will be described further with reference to FIG. 11. Firstly, when either of phase comparison result signals $\phi_{SO}$, $\phi_{SE}$ are inputted from the first phase comparison outputting portion 21, a count-up signal $\phi_{SS}$, which is a phase comparison result signal for the second delay control circuit, is generated in accordance with NOR gate 450 and inverter 452, and supplied to the second delay control circuit 18. Similarly, when either of phase comparison result signals $\phi_{RO}$, $\phi_{RE}$ are inputted from the first phase comparison outputting portion 21, a count-up signal $\phi_{RR}$, which is a phase comparison result signal for the second delay control circuit 18, is generated in accordance with NOR gate 451 and inverter 456, and supplied to the second delay control circuit 18.

When signal $\phi_{SS}$ or $\phi_{RR}$ is generated, an H pulse is generated in node N55, an H pulse signal is generated in node N56 at the rising edge of node N55 in accordance with inverter 545 and gate 455, and this signal N56 is supplied, together with a gate signal GATE to be described below, to the counter 458 by way of NAND gate 457. The signal of node N57 is also supplied to the portion (circuit constituted by gates 473–489), which generates reset signals R1, R2 to the second delay control circuit 18.

When power is turned ON, or at standby or power down mode recovery, an L level pulse reset signal $\phi_R$ is generated, the counter 458 is reset, and output N58 therefrom becomes L level. In response thereto, a gate signal GATE becomes H level in accordance with gates 462–466, and 468, 469, and is supplied to the first delay control circuit 17 and second delay control circuit 18. The circuit, which controls a delay quantity of variable delay circuits 11, 13, switches over from the first delay control circuit 17 to the second delay control circuit 18 at this time. Further, an initial pulse signal INI is generated at the rising timing of the gate signal GATE, and supplied to the second delay control circuit 18. This state is maintained by the latch circuit formed by NAND gates 462, 463.

When the gate signal GATE becomes H level, as shown in FIG. 11, an L level pulse signal is generated in the input node N57 of the counter 458 each time signal $\phi_{SS}$ or $\phi_{RR}$ is generated. When phase result signal $\phi_{SS}$ or $\phi_{RR}$ is generated 3 times, the counter 458 counts the rising edge of the node N57 pulse signal 3 times, and the output N58 of the counter 458 becomes H level. In accordance therewith, the gate signal GATE becomes L level, and the circuit, which controls a delay quantity of variable delay circuits 11, 13, switches over from the second delay control circuit 18 to the first delay control circuit 17.

Even when a lock-on signal JST is supplied from the phase comparing portion during the operation of the second delay control circuit 18, the gate signal GATE transitions to L level in accordance with NAND gate 468, and the circuit, which controls a delay quantity of variable delay circuits 11, 13, switches over from the second delay control circuit 18 to the first delay control circuit 17.

Further, the pulse signal of node N57 is also supplied to the portion (circuit constituted by gates 473–489), which generates reset signals R1, R2 to the second delay control circuit 18. As described above, when a reset signal $\phi_R$ is supplied, reset signals R1, R2 are generated simultaneously in accordance with inverter 490 and NOR gates 485, 488. Thereafter, as shown in FIG. 11, each time either signal $\phi_{SS}$ or $\phi_{RR}$ is generated, nodes N60, N61, N62 alternately repeat the states (H, L, H) and (L, H, L) in accordance with latch circuits 475, 576, 577 and the circuit comprising gates 478, 479, 480 therebetween in synchronization with the pulse signal of node N59 generated from the pulse signal of node N57, and reset signals R1, R2 are alternately generated, and supplied to the second delay control circuit 18. That is, the states of nodes N60 and N61 are fetched in synchronization with the rising edge of node N57 via NOR gates 484, 487, and reset signals R1, R2 are generated.

In the operation example shown in FIG. 11, the 3 phase comparison results, in order, constitute the generation of phase comparison result signals $\phi_{SE}$, $\phi_{SO}$, which increase delay, the generation of phase comparison result signals $\phi_{RE}$, $\phi_{RO}$, which decrease delay, and the generation of phase comparison result signals $\phi_{SE}$, $\phi_{SO}$, which increase delay.

Figure 12:
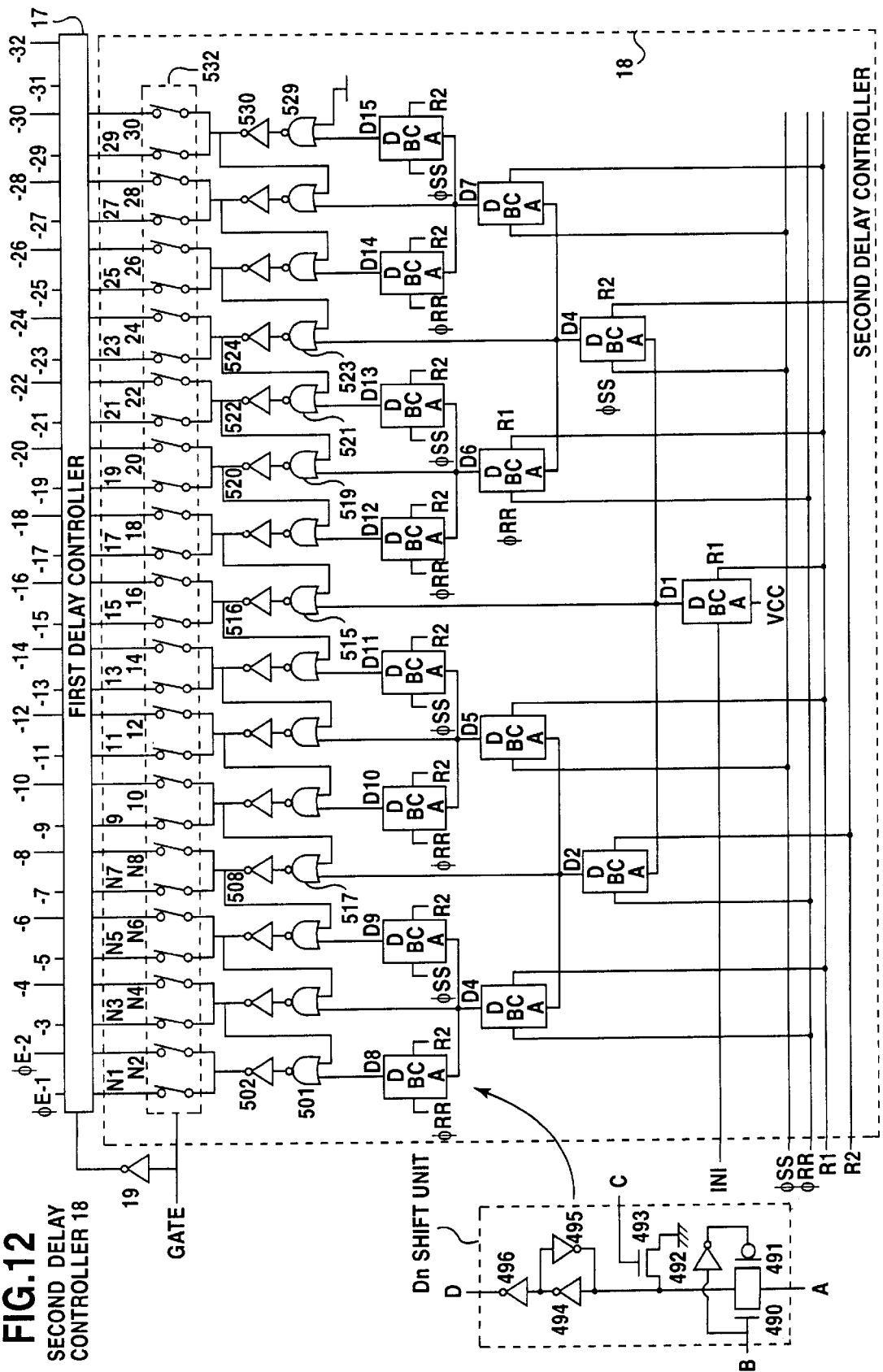
FIG. 12 is a circuit diagram of a second delay control circuit 18.
Figure 13:
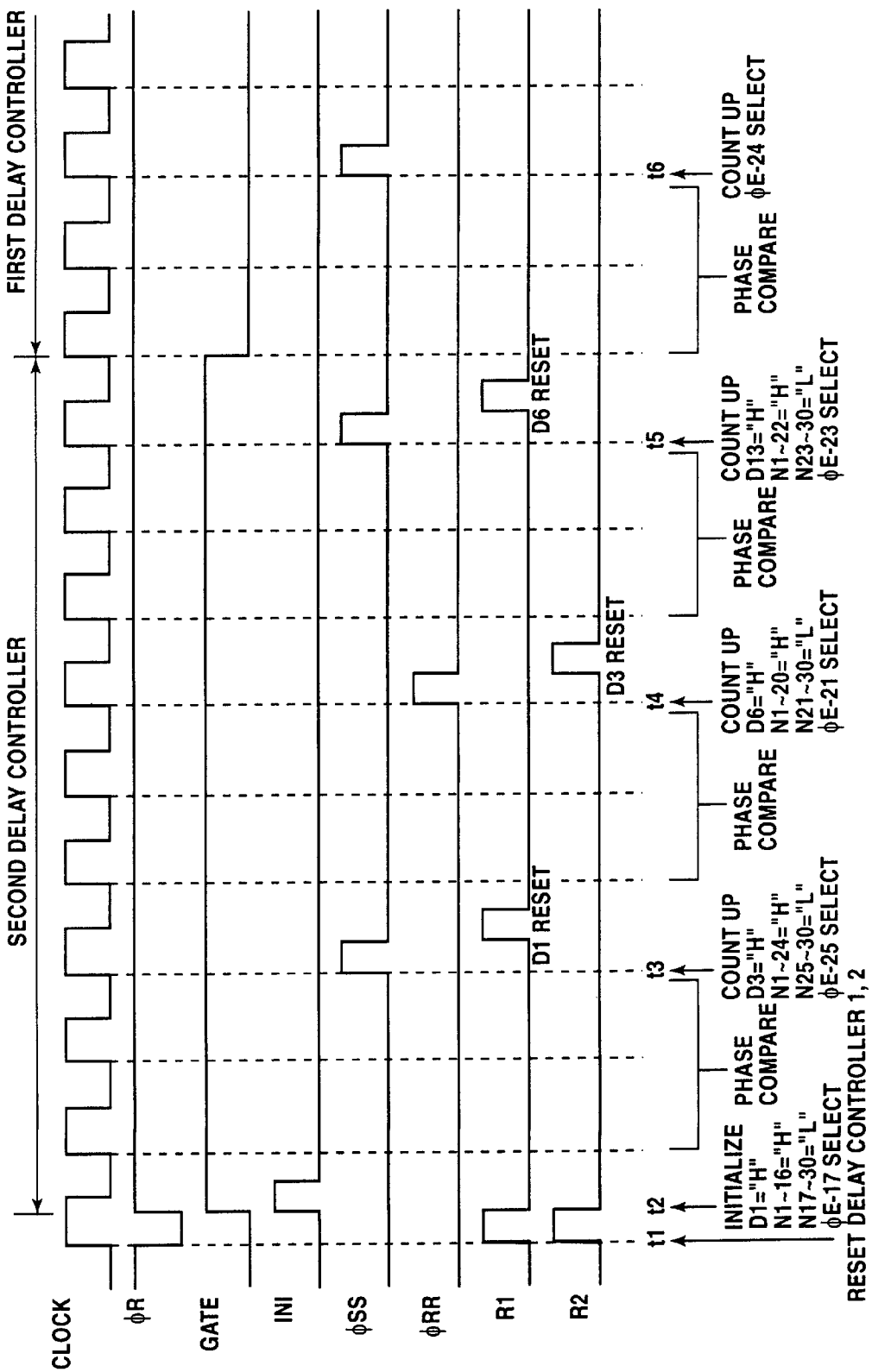
FIG. 13 is a waveform diagram showing the operation of a second delay control circuit 18.

FIG. 12 is a circuit diagram of a second delay control circuit 18. Further, FIG. 13 is a waveform diagram showing the operation of the second delay control circuit 18.

The second delay control circuit 18, based on a signal (INI, φSS, φRR, R1, R2) supplied from the phase comparator, generates a binary delay control signal N1–N30 for controlling a delay quantity of a variable delay circuit 11, 13 when the power is turned ON, or at standby or power down mode recovery. The above-mentioned supplied signals are inputted to a shift unit D1–D15. Each shift unit Dn, as is shown inside the dotted line in FIG. 12, constitutes transistor gates 490, 491, a reset transistor 493, latch circuits 494, 495, and an inverter 496. These shift units Dn output from terminal D a signal inputted to terminal A when any of signals INI, φSS, φRR transition to H level, and transfer gates 490, 491 are conductive.

As shown in FIG. 12, shift unit DI is provided in a location, which practically bisects the number of delay stages of a variable delay circuit, and external power Vcc is supplied to terminal A. Shift units D2, D3 are each provided in locations that further bisect the number of delay stages bisected by shift unit D1, and the signal of terminal D of shift unit D1 is inputted to each terminal A, respectively. Shift units D4–D7, and D8–D15 are similarly positioned, and the signal of terminal D of the shift unit installed in the previous stage is inputted to each terminal A, respectively. The output signal of terminal D of shift units D1–D15 are also simultaneously supplied to NOR gates 501–529 installed in respective latter stages. Further, the output of these NOR gates is supplied via inverters 502–530 as input to respective adjacent NOR gates.

When the gate signal GATE is H level, gates 532 are all conductive, the output of each inverter 502–530 is supplied to the first delay control circuit 17 as a binary delay control signal N1–N30, and a variable delay signal $\phi_{E-1}$–$\phi_{E-32}$ is generated as shown in FIG. 9.

The operation of the second delay control circuit 18 will be described using FIG. 13. In this aspect of the embodiment, the point, which establishes a delay quantity required for lock-on, is assumed to the location of delay control signal $\phi_{E-24}$.

Initial Value Setting (Timing t1, t2)

When power is turned ON, or at standby mode or power down recovery, signals R1, R2 are simultaneously supplied from the phase comparator as described above in synchronization with the falling edge of a reset signal $\phi_R$, and the outputs D of all shift units D1–D15 are reset to L level. Immediately thereafter, in synchronization with the rising edge of a reset signal $\phi_R$, an H level gate signal GATE and initialization signal INI are supplied from the phase comparator. When the gate signal GATE transitions to H level, the delay control operation of the first delay control circuit 17 stops, and all the switches 532 for outputting binary delay control signals N1–N30 from the second delay control circuit 18 to the first delay control circuit 17 turn ON.

When an initialization signal INI is supplied, the transfer gate of shift unit D1 turns ON, and an H level signal is outputted from output terminal D of the unit D1. Output terminals D of shift units other than shift unit D1 remain L level as-is. H level output of the unit DI is supplied to NOR gate 515. As a result thereof, of the binary delay control signals, N1–N16 become H level, N17–N30 become L level, and are supplied to the first delay control circuit 17. In this case, the delay control signal $\phi_{E-17}$ of the output side of NOR circuit 431-17 of the first delay control circuit 17 transitions to H level (not disclosed in FIG. 9), and a delay quantity corresponding to delay control signal $\phi_{E-17}$ is set in variable delay circuits 11, 13.

First Phase Comparison (Timing t3)

After delay control signal $\phi_{E-17}$ has been selected, in this example, count-up signal $\phi_{SS}$ is inputted as the comparison result of the phase comparator. When this happens, output terminal D of shift unit D3, which has signal $\phi_{SS}$ inputted to input terminal B, and an H level signal inputted to input terminal A, transitions to H level. Immediately thereafter, pulse signal R1 is supplied, output terminal D of shift unit D1 is reset, and transitions to L level.

Since the only output terminal D that transitions to H level at this point is that of shift unit D3, of the binary delay control signals, N1–N24 become H level, N25–N30 become L level, and are supplied to the first delay control circuit 17. In this case, the output delay control signal $\phi_{E-25}$ of NOR circuit 431-25 of the first delay control circuit 17 transitions to H level (not disclosed in FIG. 9), and a delay quantity corresponding to delay control signal $\phi_{E-25}$ is set in variable delay circuits 11, 13.

Second Phase Comparison (Timing t4)

After delay control signal $\phi_{E-25}$ has been selected, in this example, count-down signal $\phi_{RR}$ is inputted as the comparison result of the phase comparator. When this happens, output terminal D of shift unit D6, which has signal $\phi_{RR}$ inputted to input terminal B, and an H level signal inputted to input terminal A, transitions to H level. Immediately thereafter, pulse signal R2 is supplied, output terminal D of shift unit D3 is reset, and transitions to L level.

Since the only output terminal D that transitions to H level at this point is that of shift unit D6, of the binary delay control signals, N1–N20 become H level, N21–N30 become L level, and are supplied to the first delay control circuit 17. In this case, the output delay control signal $\phi_{E-21}$ of NOR circuit 431-21 of the first delay control circuit 17 transitions to H level (not disclosed in FIG. 9), and a delay quantity corresponding to delay control signal $\phi_{E-21}$ is set in variable delay circuits 11, 13.

Third Phase Comparison (Timing t5)

After delay control signal $\phi_{E-21}$ has been selected, in this example, count-up signal $\phi_{SS}$ is inputted as the comparison result of the phase comparator. When this happens, output terminal D of shift unit D13, which has signal $\phi_{SS}$ inputted to input terminal B, and an H level signal inputted to input terminal A, transitions to H level. Immediately thereafter, pulse signal R1 is supplied, output terminal D of shift unit D6 is reset, and transitions to L level.

Since the only output terminal D that transitions to H level at this point is that of shift unit D13, of the binary delay control signals, N1–N22 become H level, N23–N30 become L level, and are supplied to the first delay control circuit 17. In this case, the output delay control signal $\phi_{E-23}$ of NOR circuit 431-23 of the first delay control circuit 17 transitions to H level (not disclosed in FIG. 9), and a delay quantity corresponding to delay control signal $\phi_{E-23}$ is set in variable delay circuits 11, 13.

Delay Control Circuit Switchover and Thereafter (Timing t6)

Following power ON, or standby or power down mode recovery, when phase comparison result signals $\phi_{SS}$, $\phi_{RR}$ are supplied from the phase comparator, and delay quantity adjustment of the binary shift system is carried out 3 times, the gate signal GATE becomes L level, and the switches 532 for outputting binary delay control signals N1–N30 from the second delay control circuit 18 to the first delay control circuit 17 turn OFF. Further, an inverted signal of the gate signal GATE to be supplied to the first delay control circuit 17 becomes H level. Consequently, the circuit that controls a delay quantity of a variable delay circuit 11, 13 switches from the second delay control circuit 18 to the first delay control circuit 17. A delay quantity control of thereafter constitutes the single shift system of the first delay control circuit 17 (FIG. 9).

Because delay control signal E-23 has already been selected at the point when binary shift system delay quantity control is performed 3 times following power ON, or standby mode recovery, single shift system delay quantity control need only be carried out 1 more time in order to set a delay quantity that corresponds to delay control signal $\phi_{E-24}$, which is a delay quantity point required for lock-on. Therefore, as shown in FIG. 13, the delay control signal shifts from $\phi_{E-23}$ to $\phi_{E-24}$ by the single shift system at timing t6, and a lock-on state is achieved. In other words, whereas the number of times phase comparison is performed between power ON, or standby mode recovery, and lock-on is 23 times if using the single shift system of the conventional example alone, with this aspect of the embodiment, phase comparison is only performed 4 times, enabling lock-on time to be greatly shortened.

Second Aspect of the Embodiment

Figure 14:
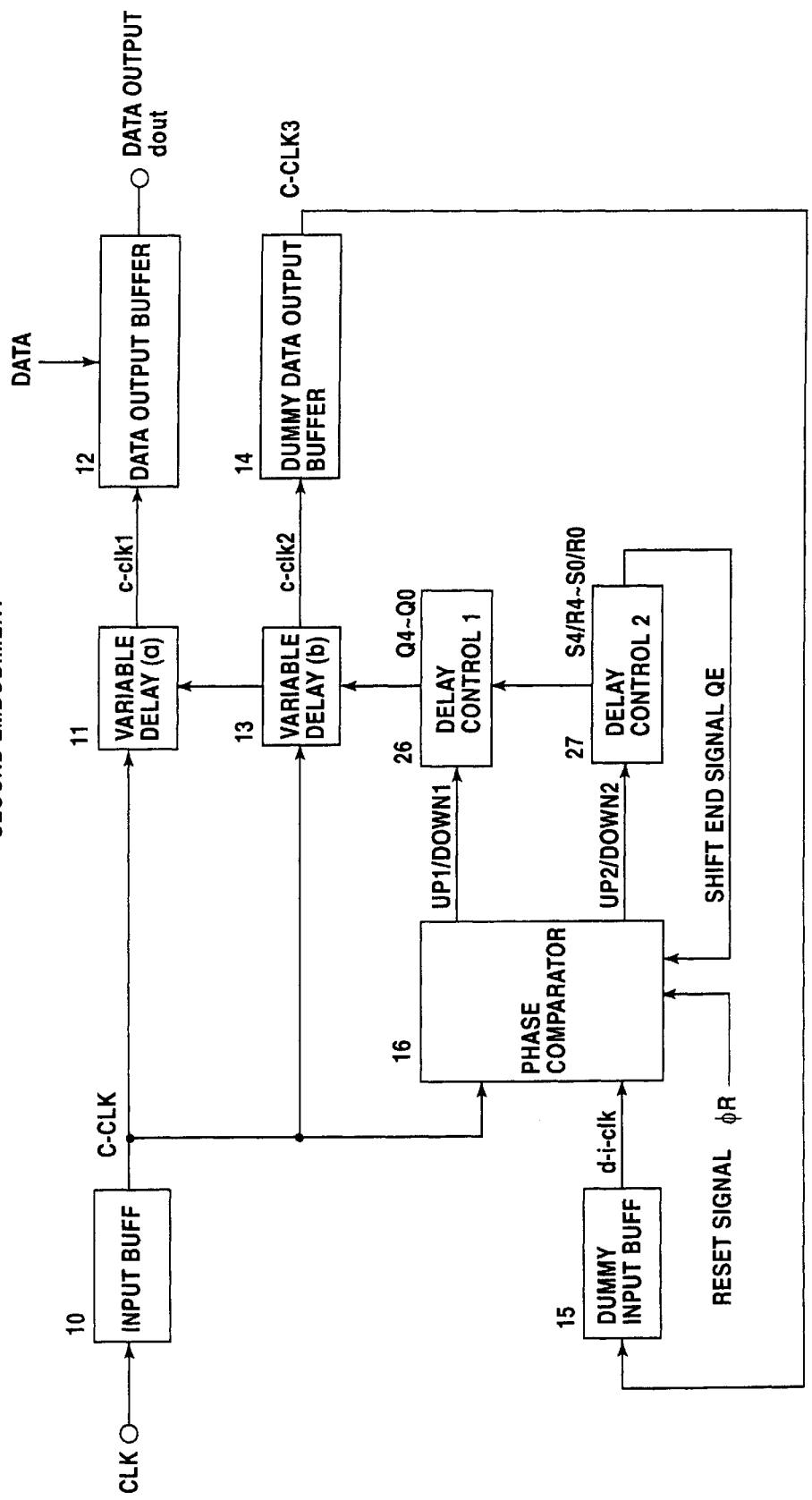
FIG. 14 is a schematic diagram showing a DLL circuit of a second aspect of the embodiment.

FIG. 14 is a schematic diagram showing a DLL circuit of a second aspect of the embodiment. The same reference numerals are furnished for those portions that correspond to the first aspect of the embodiment of FIG. 2. By way of describing the portions that differ from the first aspect of the embodiment, in the second aspect of the embodiment, the phase comparator 16 supplies a phase comparison result signal UP1, DOWN1 to a first delay control circuit 26 during normal operation (first operating period), and the first delay control circuit 26 generates a delay control signal Q0–Q4 of the single shift system. Further, as for the predetermined period (second operating period) at power ON and standby or power down mode recovery, the phase comparator 16 supplies a phase comparison result signal UP2, DOWN2 to a second delay control circuit 27, and the second delay control circuit 27 generates a delay control signal S0, R0–S4, R4 of the binary shift system, and a delay control signal Q0–Q4 corresponding thereto is supplied to the a variable delay circuit 11, 13.

In the second aspect of the embodiment, a reset signal $\phi_R$ generated at power ON and standby or power down mode recovery is supplied to the phase comparator 16, and when delay setting in accordance with the binary shift system during the second operating period is complete, a shift end signal QE is generated from the second delay control circuit 27, and supplied to the phase comparator 16, and the DLL circuit transitions to the first operating period.

Figure 15:
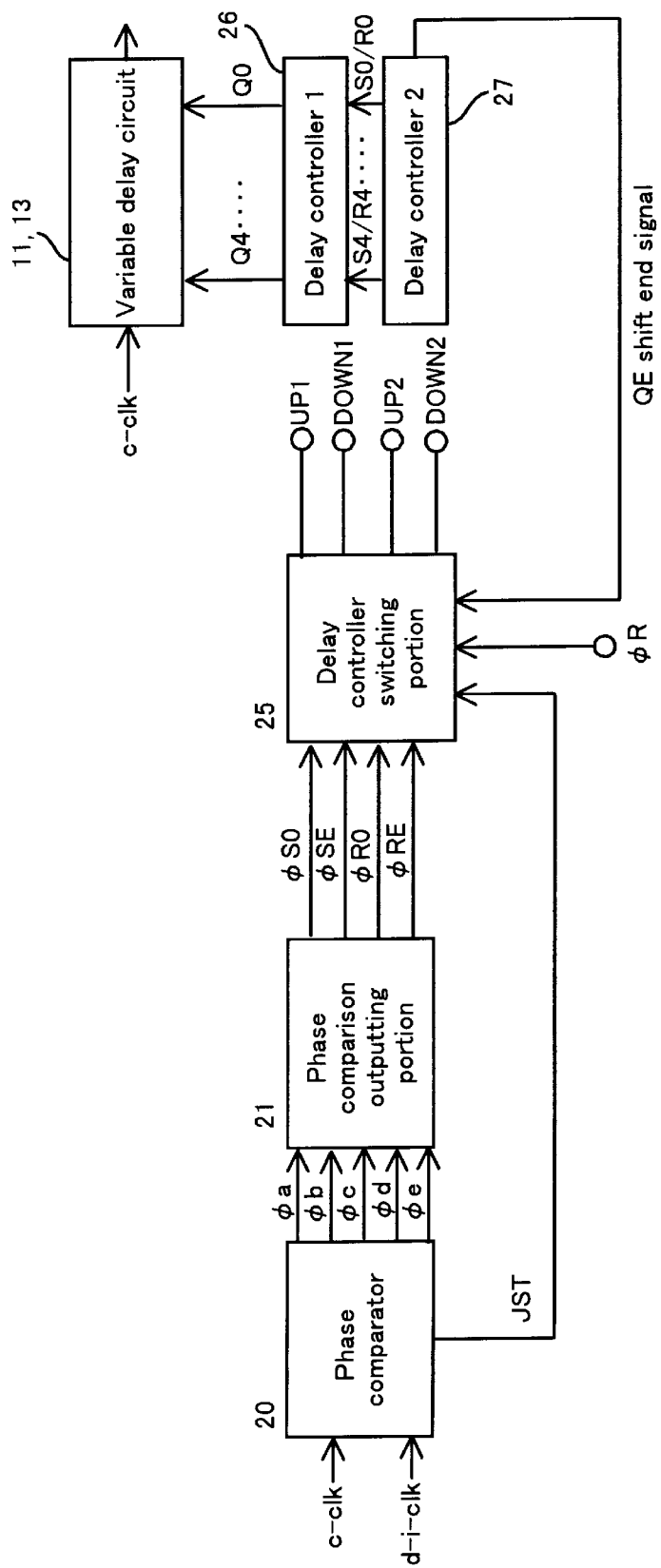
FIG. 15 is a schematic diagram showing a phase comparator 16 of a second aspect of the embodiment.

FIG. 15 is a schematic diagram of the phase comparator 16 of the second aspect of the embodiment. In the example of FIG. 15, the phase comparator 16 has a phase comparing portion 20 for comparing a first clock c-clk against a second clock d-i-clk that delays same; a phase comparison result outputting portion 21, which is supplied with a signal $\phi_a$–$\phi_e$ generated therefrom, and which generates a phase comparison result signal $\phi_{SO}$-$\phi_{RE}$; and a delay control circuit switching portion 25, which is supplied with a phase comparison result signal $\phi_{SO}$-$\phi_{RE}$, and which appropriately supplies a phase comparison result signal UP1, DOWN1 and UP2, DOWN2 therefrom to the first delay control circuit 26 and the second delay control circuit 27, respectively.

The phase comparing portion 20 is the same circuit constitution as the phase comparing portion 20 of the first aspect of the embodiment, shown in FIG. 5. Further, the phase comparison outputting portion 21 is the same circuit constitution as the phase comparison outputting portion 21 of the first aspect of the embodiment, shown in FIG. 7. The delay control switching portion 25, first delay control circuit 26, and second delay control circuit 27 will be described hereinbelow.

In the phase comparator 16 of FIG. 15, a reset signal $\phi_R$ is supplied to the delay control circuit switching portion 25 at normal operation start, and a phase comparison result signal UP2, DOWN2 is supplied to the second delay control circuit 27. When the second delay control circuit 27 completes a delay quantity setting operation, and generates a shift end signal QE, or the phase comparing portion 20 generates a lock-on signal JST indicating locked on, the delay control circuit switching portion 25 supplies a phase comparison result signal UP1, DOWN1 to the first delay control circuit 26. Furthermore, in the second aspect of the embodiment, the reset signal $\phi_R$ is an H level pulse signal which differs from that of the first aspect of the embodiment.

Figure 16:
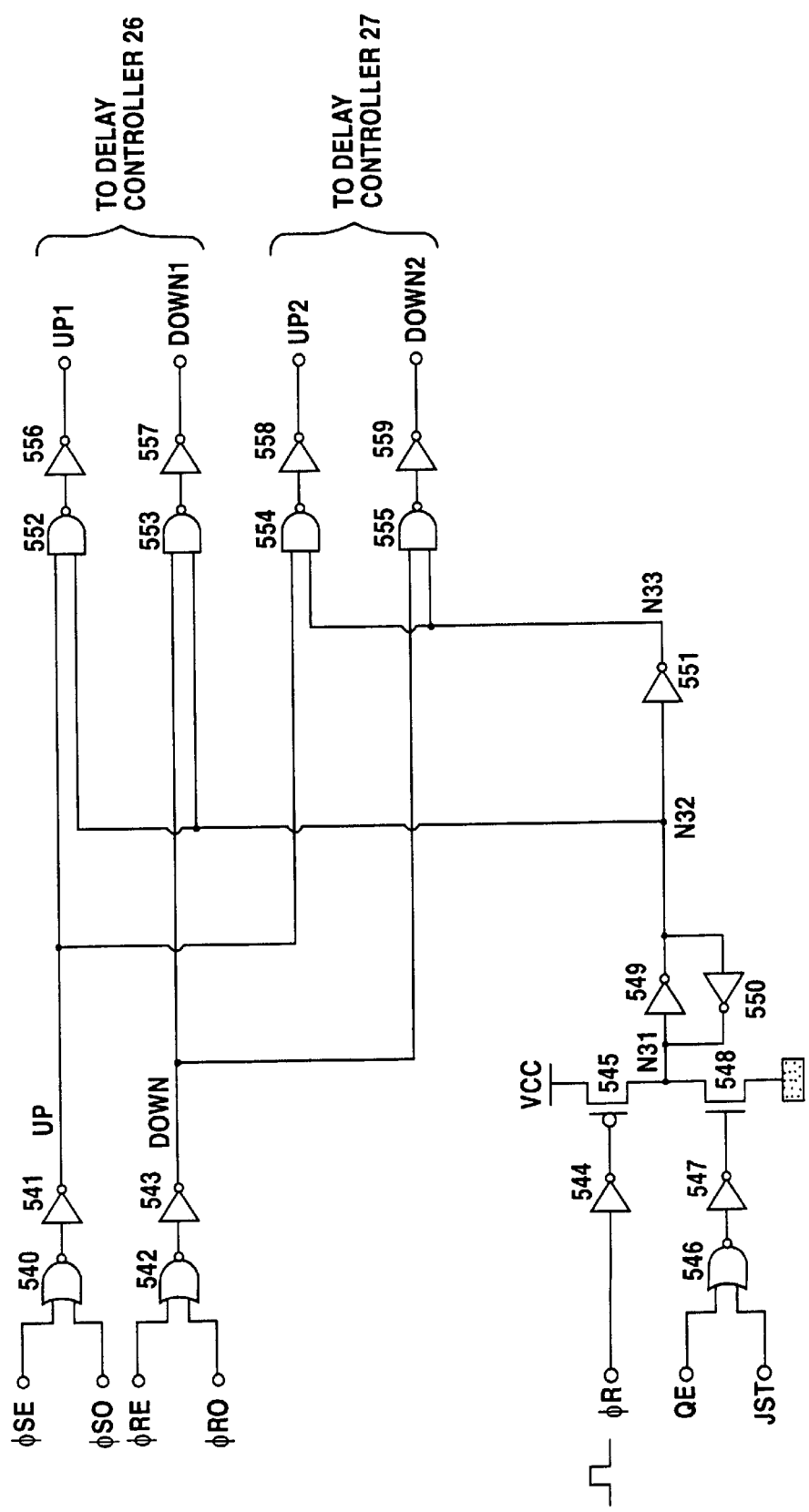
FIG. 16 is a circuit diagram of a delay control circuit switching portion 25.

FIG. 16 is a circuit diagram of the delay control circuit switching portion 25. In this circuit, when a count-up signal $\phi_{SO}$, $\phi_{SE}$ is inputted from the phase comparison outputting portion 21, a signal UP is generated in accordance with a NOR gate 540 and an inverter 541, and when a count-down signal $\phi_{RO}$, $\phi_{RE}$ is inputted, a signal DOWN is generated. These signals are supplied to either the first delay control circuit 26 or the second delay control circuit 27 by way of NAND gates 552–555 and inverters 556–559.

When an H level pulse reset signal $\phi_R$ is supplied at power ON or standby or power down mode recovery, a P-channel transistor 545 is made to conduct in accordance with an inverter 544. At that time, the shift end signal QE is L level. Since the lock-on signal JST is L level at this time, an N-channel transistor 548 turns OFF, and node N31 transitions to H level. This state is latched by inverters 549, 550. Because node N32 becomes L level in accordance therewith, the UP1 signal and DOWN1 signal supplied to the first delay control circuit 26 are always L level. Further, since node N33 becomes H level, an effective signal UP2 or signal DOWN2 is supplied to the second delay control circuit 27 as a phase comparison result signal, and phase adjustment is performed in accordance with the binary shift system.

When phase adjustment in accordance with the binary shift system is complete, the shift end signal QE transitions to H level, and an N-channel transistor 548 turns ON. Since the reset signal $\phi_R$ is L level at this time, the P-channel transistor 545 turns OFF, node N31 become L level, and the latch state of inverters 549, 550 is inverted. In accordance therewith, because node N33 is L level, the signal UP2 and signal DOWN2 supplied to the second delay control circuit 27 are always L level. Further, since node N32 becomes H level, an effective signal UP1 or signal DOWN1 is supplied to the first delay control circuit 26 as a phase comparison result signal, and phase adjustment is performed in accordance with the single shift system.

When a lock-on signal JST is generated prior to completion of phase adjustment in accordance with the binary shift system, the N-channel transistor 548 turns ON, and node N31 becomes L level. And then, the same as when phase adjustment in accordance with the binary shift system ends, the DLL circuit switches to phase adjustment in accordance with the single shift system.

Figure 17:
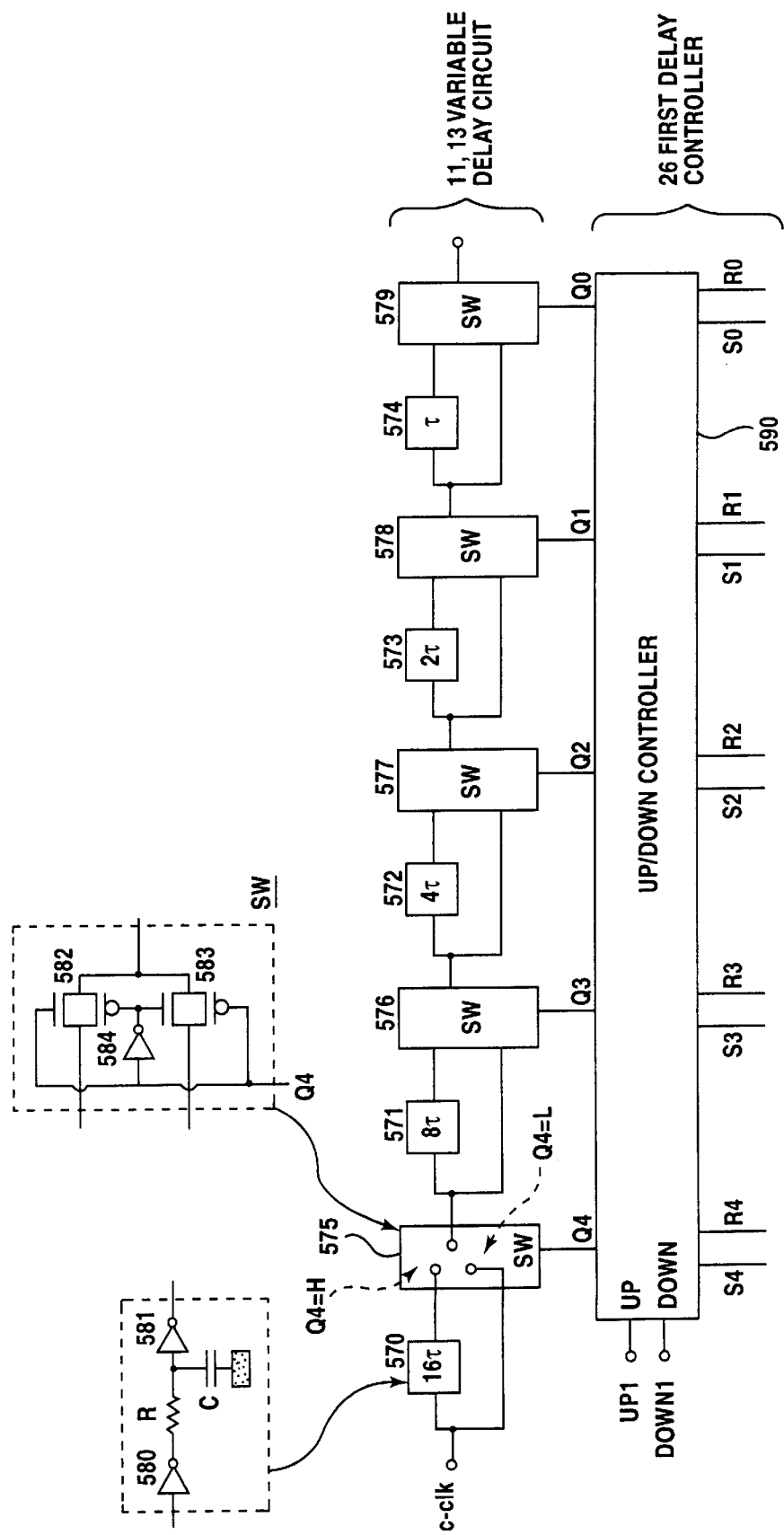
FIG. 17 is a circuit diagram showing variable delay circuits 11, 13 and a first delay control circuit 26 in a second aspect of the embodiment.

FIG. 17 is a circuit diagram showing variable delay circuits 11, 13 and the first delay control circuit 26 in the second aspect of the embodiment.

Variable delay circuits 11, 13 constitute 5 delay units 570–574, and switch units 575–579 provided therebetween. A delay unit constitutes inverters 580, 581, a resistor R, and a capacitor C, as shown inside the dotted lines in the figure. As for a delay quantity of each delay unit, this delay quantity is set to the second power, such as τ, 2τ, . . . , 16τ from delay unit 570 toward 574 in accordance with changing the resistance value R, or the capacitance of the capacitor C inside a unit.

A control signal Q0–Q4 from the first delay control circuit 26 is supplied to a switch unit 575–579 between each delay unit. Each switch unit constitutes an inverter 584, and CMOS transfer gates 582, 583, as shown inside the dotted line in the figure, and whether or not a clock signal c-clk is propagated via a delay unit corresponding to a switch unit is determined in accordance with the control signal Q0–Q4 setting. For example, when control signal Q4 is H level, a clock signal c-clk is propagated via the 16τ delay unit 570, and when same is L level, a clock signal c-clk is propagated without passing through the 16τ delay unit 570.

The total of the delay quantities of delay units corresponding to H level control signals Q0–Q4 constitute a delay quantity of variable delay circuits 11, 13. This delay quantity is equivalent to the counter value when the array of signal levels of control signals Q0–Q4 are treated as a binary counter. For example, when control signals Q1, Q0 are H level, the counter value is 00011, and a delay quantity of a variable delay circuit 11, 13 becomes 3τ ($=2^1\tau+2^0\tau$), and when control signals Q4, Q2, Q0 are H level, the counter value is 10101, and a delay quantity of a variable delay circuit 11, 13 becomes 21τ ($=2^4\tau+2^2\tau+2^0\tau$).

The first delay control circuit 26 constitutes a 5-bit UP/DOWN counter 590. This counter 590 generates a delay control signal Q0–Q4 on the basis of either a count-up signal UP1 and count-down signal DOWN1 from the phase comparator, or a delay set signal S0–S4 and delay reset signal R0–R4 from the second delay control circuit 27, and supplies same to the switch units 575–579 of a variable delay circuit 11, 13.

FIG. 18 is a diagram showing the operation of the counter 590. During normal operation (first operating period), a count-up signal UP1 and a count-down signal DOWN1 are supplied from the phase comparator. When signal UP1 is supplied, the count value comprising delay control signals Q0–Q4 counts up as shown in FIG. 18, causing a delay quantity in a variable delay circuit 11, 13 to increase 1τ each. When signal DOWN1 is supplied, in the same manner, the count value comprising delay control signals Q0–Q4 counts down, causing a delay quantity in a variable delay circuit 11, 13 to decrease IT each. In this manner, a delay quantity of a variable delay circuit 11, 13 is adjusted by a single shift system in accordance with signal UP1 and signal DOWN1.

At power ON, or standby or power down mode recovery, as described above, the supply of signal UP1 and signal DOWN1 is stopped, and a delay set signal S0–S4 and a delay reset signal R0–R4 is supplied from the second delay control circuit 27. When a delay set signal is generated, the corresponding delay control signal Q0–Q4 is set to H level, and when a delay reset signal is generated, the corresponding delay control signal Q0–Q4 is set to L level. In this case, as will be described below, a delay quantity of a variable delay circuit 11, 13 is adjusted by the binary shift system. That is, a delay set, reset signal corresponds to a binary delay signal, and a delay control signal Q0–Q4 is set in accordance therewith.

Figure 19:
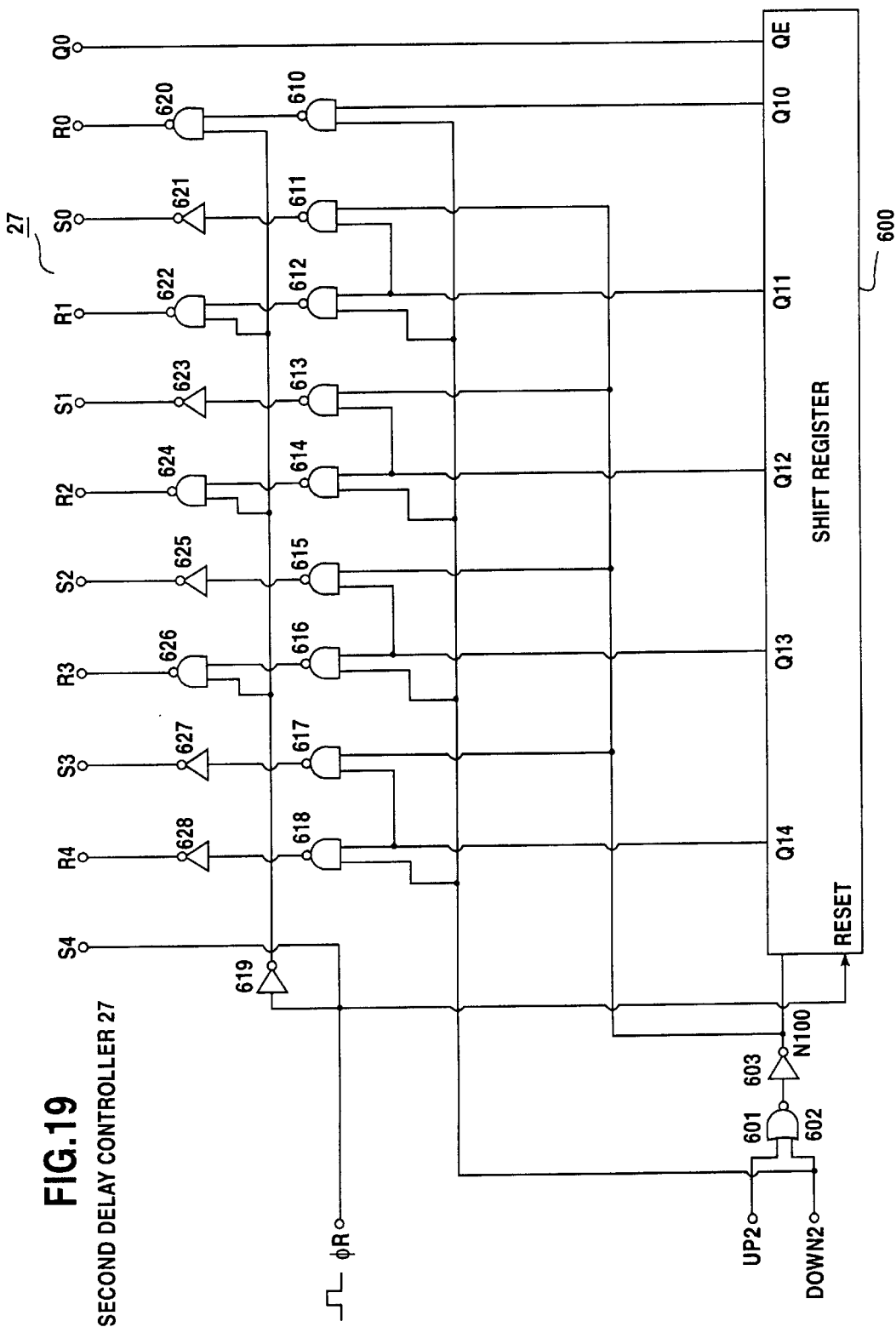
FIG. 19 is a circuit diagram of a second delay control circuit 27.
Figure 20:
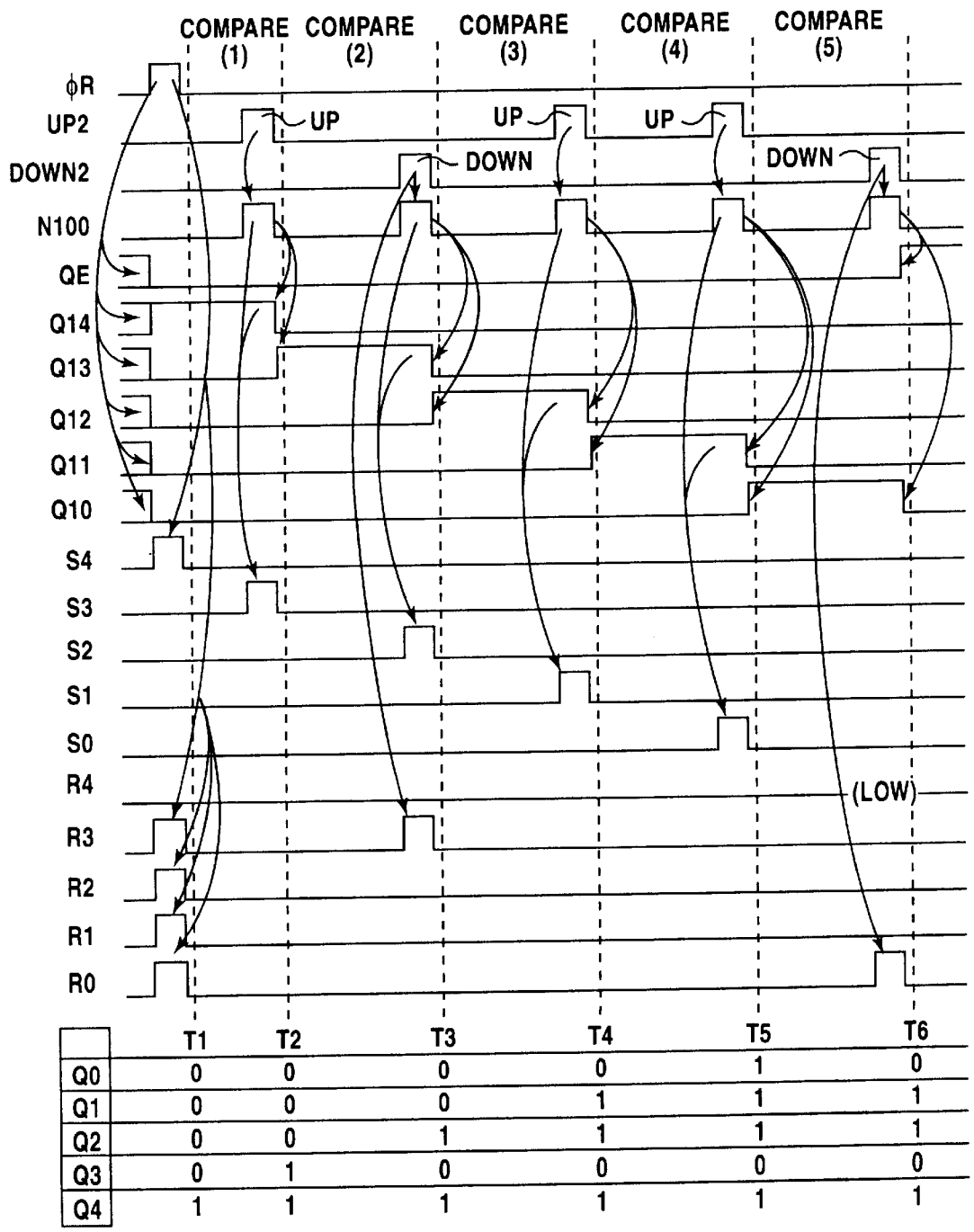
FIG. 20 is a waveform diagram showing the operation of a second delay control circuit 27.

FIG. 19 is a circuit diagram of the second delay control circuit 27. Further, FIG. 20 is a waveform diagram of the operation of the second delay control circuit 27. This second delay control circuit 27 constitutes a 5-bit shift register 600, and a circuit of NAND gates 610–618, to which the 5-bit output thereof Q10–Q14 is supplied, and inverters or NAND gates 620–628, to which the outputs thereof are supplied, for generating a delay set signal Sn and a delay reset signal Rn. Rn, as shown in FIG. 17, is supplied to respective bits of the binary counter 590 inside the first delay control circuit 26. At power ON or standby on power down mode recovery, a delay quantity of a variable delay circuit 11, 13 is controlled based on this signal Sn, Rn (binary delay control signal).

The operation of the second delay control circuit 27 in the second operating period is described in accordance with FIG. 20.

Initial Value Setting (Timing T1)

When power is turned ON, or at standby or power down mode recovery (second operating period), an H level pulse reset signal $\phi_R$ is supplied, the shift register 600 is reset, the output therefrom Q10–Q13 and a shift end signal QE are set to L level, and the most significant output Q14 is set to H level, respectively. Further, in accordance with inverter 619, and NAND gates 620, 622, 624, 626, a delay reset signal R0–R3, and a delay set signal S4 become H level pulse signals in synchronization with the reset signal $\phi_R$.

Because a count-up signal UP2 and a count-down signal DOWN2, which is a phase comparison result signal supplied from the phase comparator 20, both are L level immediately after the reset signal $\phi_R$ is supplied (timing T1 in FIG. 20), delay reset signal R4 is set to L level in accordance with NAND gate 618 and inverter 628. And because node N100 also becomes L level, a delay set signal S0–S3 is set to L level in accordance with NAND gates 611, 613, 615, 617.

The delay set signals S0–S4 and delay reset signals R0–R4 set as described above are supplied to the first delay control circuit 26. At this time, a delay control signal Q4 is set to H level by a control signal from the first delay control circuit 26, and the counter value of counter 590 becomes 10000. Therefore, a delay quantity set in a variable delay circuit 11, 13 at timing T1 constitutes 16τ ($=2^4\tau$). This value is equivalent to roughly ½ of 31τ ($=2^4\tau+2^3\tau+2^2\tau+2^1\tau+2^0\tau$), the maximum delay quantity of a variable delay circuit 11, 13.

Phase Comparison Operation (Phase Comparison 1, Timing T2)

In the phase comparison operations hereinafter, in response to a signal UP2, DOWN2, a delay set signal Sn, which corresponds to lower position, successively becomes an H level pulse, and in response to signal DOWN2, a delay reset signal Rn+1, which corresponds to an upper position thereto, returns to L level.

Firstly, the result of an initial phase comparison 1 is inputted as a count-up signal UP2. In accordance therewith, a pulse signal is generated at node N100, and supplied to the shift register 600 and NAND gates 611, 613, 615, 617, which generate a delay set signal S0–S3. At the point in time when pulse signal N100 is generated, because Q14 is the shift register output set to H level, an H level pulse signal is generated in accordance with NAND gate 617 and inverter 627 to delay set signal S3, which corresponds to the position subsequent thereto. Further, in synchronization with the falling edge of the node N100 pulse signal, shift register output Q14 is set to L level, and output Q13 is set to H level.

Delay set signals S0–S4 and delay reset signals R0–R4 set as described above are supplied to the first delay control circuit 26. At this time, delay control signals Q4, Q3 are set to H level by a delay control signal from the first delay control circuit 26, and the counter value becomes 11000. Therefore, a delay quantity set in a variable delay circuit 11, 13 at timing T2 constitutes 24τ ($=2^4\tau+2^3\tau$). This value is equivalent to roughly ¾ ($=½+¼$) of the maximum delay quantity of a variable delay circuit 11, 13.

Phase Comparison Operation (Phase Comparison 2, Timing T3)

The result of the next phase comparison 2 is inputted as a count-down signal DOWN2. In accordance therewith, a pulse signal is generated in node N100, and supplied to the shift register 600 and NAND gates 611, 613, 615, 617, which generate a delay set signal S0–S3. At the point in time when pulse signal N100 is generated, because Q13 is the shift register output set to H level, an H level pulse signal is generated in accordance with NAND gate 615 and inverter 625 to delay set signal S2, which corresponds to the position subsequent thereto. Further, in synchronization with the falling edge of the node N100 pulse signal, shift register output Q13 is set to L level, and output Q12 is set to H level.

A count-down signal DOWN2 is also supplied to a NAND gate 610, 612, 614, 616, 618, which generates a delay reset signal R0–R4. At the point in time when a count-down signal DOWN2 is inputted, since Q13 is the output of the shift register, which has been set to H level, an H level pulse signal is generated at the delay reset signal R3 in accordance with NAND gates 616, 626. As a result thereof, the output Q3 of counter 590 returns to L level (0 value).

Delay set signals S0–S4 and a delay reset signals R0–R4 set as described above are supplied to the first delay control circuit 26. At this time, delay control signals Q4, Q2 are set to H level by a control signal from the first delay control circuit 26, and the counter value becomes 10100. Therefore, a delay quantity set in a variable delay circuit 11, 13 at timing T3 constitutes $20\tau$ $(=2^4\tau+2^2\tau)$. This value is equivalent to roughly $5/8$ $(=3/4-1/8)$ of the maximum delay quantity of a variable delay circuit 11, 13.

Subsequent Phase Comparison Operations (Phase Comparisons 3, 4, 5, Timing T4, T5, T6)

Similar to phase comparisons 1 and 2, a pulse signal is generated in node N100 in accordance with the supply of a count-up signal UP2 or a count-down signal DOWN2. In synchronization with the falling edge of the pulse signal thereof, the shift register output, which is set to H level, shifts sequentially from Q12 to Q10, and finally a shift end signal QE is generated from output QE and supplied to the delay control circuit switching portion 25 inside the phase comparator.

In accordance with the output of the shift register 600 set to H level shifting from Q12 to Q10, a pulse signal is sequentially generated from a delay set signal S1–S0. Further, when a count-down signal is supplied, a delay reset signal R0 corresponding to a shift register output set at H level is generated. On the basis thereof, the level of a delay control signal Q4–Q0 from the first delay control circuit 26 is set, and a delay quantity of a variable delay circuit 11, 13 is controlled in accordance with the binary shift system.

When the 5-bit delay control signal Q4–Q0 is completed, a shift end signal QE is generated, and as described hereinbelow, the supply of signals UP2, DOWN2 to the second delay control circuit 27 is stopped, and the circuit, which controls a delay quantity of a variable delay circuit 11, 13, switches from the second delay control circuit 27 to the first delay control circuit 26. Similarly, the circuit is switched to the first delay control circuit 26 even when a lock-on signal JST is generated by the phase comparator.

As described above, according to the present invention, when power is turned ON, and at recovery from a power down mode, that is, during the second operating period when the DLL circuit starts normal operation, the setting of a delay quantity in accordance with a clock phase comparison result is changed and set by a binary unit, and at the normal operation of thereafter (first operating period), the setting of a delay quantity in accordance with a clock phase comparison result is changed and set by a minimum delay unit of a variable delay circuit. Therefore, during a predetermined period (second operating period) from the start of normal operation, a delay quantity, at which lock-on will be performed, or a delay quantity approximating same can be set, making it possible to shorten the time until lock-on. And since a delay quantity is shifted in minimum delay units during normal operation (first operating period), the operation of the DLL circuit can be made stable.

What is claimed is:

1. A DLL circuit, which delays a first clock, and generates a control clock having a predetermined phase relation with the first clock, the DLL circuit, comprising:

a variable delay circuit for variably delaying said first clock;

a phase comparator for comparing the phase of said first clock with that of a second clock generated by delaying for a predetermined period the output of said variable delay circuit, and for generating a phase comparison result signal; and a delay control circuit for supplying, in response to said phase comparison result signal, a delay control signal, to said variable delay circuit, which controls a delay quantity thereof, wherein said delay control circuit generates a single delay control signal as said delay control signal, which shifts by a minimum delay quantity unit said delay quantity of said variable delay circuit in a first operating period of said DLL circuit, and generates a binary delay control signal as said delay control signal, which shifts by a binary unit said delay quantity of said variable delay circuit in a second operating period, which differs from said first operating period.

2. The DLL circuit according to claim 1, wherein: said delay control circuit has a first delay control circuit, which is activated in said first operating period, and which generates said single delay control signal; and a second delay control circuit, which is activated in said second operating period, and which generates said binary delay control signal.

3. The DLL circuit according to claim 1, wherein:

said variable delay circuit has a plurality of gates connected in series, and the number of gates through which said first clock passes is variably set in accordance with said delay control signal, and the number of gates inside said variable delay circuit is changed by said minimum delay quantity unit in accordance with a delay control signal generated by said single delay control signal, and the number of gates inside said variable delay circuit is changed in succession to $1/2$ of the total, and thereafter to $1/4$ or $3/4$ . . . , and thereafter to either one among $(2^1-1)/2^n-(2^n-1)/2^n$ (provided the numerator is an odd number) in accordance with a delay control signal generated by said binary delay control signal.

4. The DLL circuit according to claim 1, wherein:

said variable delay circuit has a plurality of delay units, delay quantities of which are weighted in binary, and a delay unit, through which said first clock passes, is variably selected in accordance with said delay control signal, and a delay unit inside said variable delay circuit is changed, by a unit of the delay unit having said minimum delay quantity, in accordance with a delay control signal generated by said single delay control signal, and a delay unit inside said variable delay circuit is changed in succession so that the delay therein either becomes $1/2$ of the total, and thereafter $1/4$ or $3/4$ . . . , and thereafter becomes either one among $(2^1-1)/2^n-(2^n-1)/2^n$ (provided the numerator is an odd number) in accordance with a delay control signal generated by said binary delay control signal.

5. The DLL circuit according to any of claims 1 through 4, wherein:
said second operating period is a period at the start of a normal operation of said DLL circuit, and said first operating period is a period at a normal operating period following said second operating period.

6. The DLL circuit according to claim 5, wherein:
said phase comparator performs a phase comparison operation a predetermined number of times in said second operating period, and said DLL circuit transitions to said first operating period after said predetermined number of phase comparison operations.

7. The DLL circuit according to claim 6, which transitions to said first operating period after said phase comparator detects the phases of said first and second clocks being matched during said second operating period.

8. A DLL circuit, which delays a first clock, and generates a control clock having a predetermined phase relation with the first clock, the DLL circuit, comprising:
a variable delay circuit; for variably delaying said first clock;
a phase comparator for comparing the phase of said first clock against that of a second clock generated by delaying for a predetermined period a clock outputted from said variable delay circuit, and for generating a phase comparison result signal corresponding to the phase relation of said first and second clocks; and
a delay control circuit for supplying, in response to said phase comparison result signal, a delay control signal which controls a delay quantity, to said variable delay circuit, so that the phases of said first and second clocks are matched,
wherein said delay control circuit, having a first delay control circuit, which is activated in a normal operating period other than either a normal operation start period or a normal operation restart period of said DLL circuit, and which generates a single delay control signal for changing by a minimum delay quantity unit a delay quantity of said variable delay circuit; and a second delay control circuit, which is activated either in said normal operation start period, or in a normal operation restart period of said DLL circuit, and which generates a binary delay control signal for changing by a binary unit a delay quantity of said variable delay circuit, and
said second delay control circuit generates said binary delay control signal in response to a predetermined number of phase comparison result signals, which said phase comparator generates after either said normal operation start or normal operation restart; and said first delay control circuit generates said single delay control signal in response to a phase comparison result signal, which said phase comparator generates in said normal operating period.

9. The DLL circuit according to claim 8, wherein said phase comparator supplies to said first and second delay control circuits an activation signal, which activates said second delay control circuit after either said normal operation start or normal operation restart, and which activates said first delay control circuit in said normal operating period.

10. The DLL circuit according to claim 8 or 9, wherein:
said variable delay circuit has a plurality of gates connected in series; and
said first delay control circuit generates said single delay control signal for changing by said minimum delay quantity unit said number of pass-through gates in response to said phase comparison result signal, and said second delay control circuit generates said binary delay control signal for sequentially changing, in response to said phase comparison result signal, the number of pass-through gates so that a delay quantity of said pass-through gate constitutes ½ of the total delay quantity, and thereafter ¼ or ¾ ..., and thereafter either one among $(2^1-1)/2^n-(2^n-1)/2^n$ (provided the numerator is an odd number).

11. The DLL circuit according to claim 8 or 9, wherein:
said delay control signal has a plurality of control signals corresponding from a small delay quantity to a large delay quantity of said variable delay circuit,
said second delay control circuit includes a first layer unit circuit, which outputs an activation level control signal; 2 second layer unit circuits, which each outputs the activation level control signal outputted by said first layer unit circuit; and $2^{N-1}$ Nth layer unit circuits (N is an integer larger than 3), which each outputs the activation level control signal outputted by an (N-1)th layer unit circuit; sequentially activates, in response to said phase comparison result signal, the output of one unit circuit within each said layer unit circuits; and generates said binary delay control signal in accordance with said activation level control signal.

12. The DLL circuit according to claim 8, wherein:
said phase comparator supplies said phase comparison result signal, which is effective, to said second delay control circuit, after either said normal operation start, or normal operation restart; and supplies said phase comparison result signal which is effective, to said first delay control circuit in said normal operating period.

13. The DLL circuit according to either claim 8 or 12, wherein:
said variable delay circuit has a plurality of delay units, delay quantities of which are weighted in binary, and the delay units, through which said first clock passes, are variably selected in accordance with said delay control signal,
said first delay control circuit generates said single delay control signal for changing by a unit of a delay unit having said minimum delay quantity said pass-through delay units in response to said phase comparison result signal, and
said second delay control circuit generates said binary delay control signal for sequentially changing, in response to said phase comparison result signal, said pass-through delay units so that a delay quantity of said pass-through delay units constitutes ½ of the total delay quantity, and thereafter ¼ or ¾ ..., and thereafter either one among $(2^1-1)/2^n-(2^n-1)/2^n$ (provided the numerator is an odd number).

14. The DLL circuit according to either claim 8 or 12, wherein:
said delay control signal has a plurality of control signals corresponding from a small delay quantity to a large delay quantity of said variable delay circuit,
said first delay control circuit has a binary counter, which generates said single delay control signal by counting up or counting down in response to said phase comparison result signal, and
said second delay control circuit generates a binary delay control signal, which sequentially sets said binary counter from an upper bit to a lower bit in response to said phase comparison result signal.

* * * * *